United States Patent
Gwak et al.

(10) Patent No.: US 10,818,549 B2
(45) Date of Patent: *Oct. 27, 2020

(54) SEMICONDUCTOR DEVICES INCLUDING CONTACT PLUGS

(71) Applicant: SAMSUNG ELECTRONICS CO., LTD., Suwon-si, Gyeonggi-do (KR)

(72) Inventors: Min Chan Gwak, Hwaseong-si (KR); Hwi Chan Jun, Yongin-si (KR); Heon Jong Shin, Yongin-si (KR); So Ra You, Cheonan-si (KR); Sang Hyun Lee, Hwaseong-si (KR); In Chan Hwang, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/724,483

(22) Filed: Dec. 23, 2019

(65) Prior Publication Data
US 2020/0126858 A1    Apr. 23, 2020

Related U.S. Application Data

(63) Continuation of application No. 15/959,783, filed on Apr. 23, 2018, now Pat. No. 10,553,484.

(30) Foreign Application Priority Data

Nov. 1, 2017 (KR) .................. 10-2017-0144727

(51) Int. Cl.
H01L 21/768        (2006.01)
H01L 23/522        (2006.01)
(Continued)

(52) U.S. Cl.
CPC ...... *H01L 21/76897* (2013.01); *H01L 23/528* (2013.01); *H01L 23/5226* (2013.01);
(Continued)

(58) Field of Classification Search
CPC .......... H01L 21/76897; H01L 23/5226; H01L 23/5283; H01L 29/41775; H01L 29/41791; H01L 29/6656
See application file for complete search history.

(56) References Cited

U.S. PATENT DOCUMENTS 7,745,275 B2    6/2010  Yeric et al.
8,969,922 B2    3/2015  Liu et al.
(Continued)

FOREIGN PATENT DOCUMENTS

KR    10-2013-0023747 A    3/2013

*Primary Examiner* — Dale E Page
*Assistant Examiner* — Quovaunda Jefferson
(74) *Attorney, Agent, or Firm* — Sughrue Mion, PLLC

(57) ABSTRACT

A semiconductor device includes active regions, a gate electrode, respective drain regions, respective source regions, a drain contact structure, a source contact structure, and a gate contact structure. The active regions extend linearly in parallel on a substrate. The gate electrode crosses the active regions. The drain regions are on and/or in the active regions on a first side of the gate electrode. The respective source regions are on and/or in the active regions on a second side of the gate electrode. The drain contact structure is on multiple drain regions. The source contact structure is on multiple source regions. The gate contact structure is on the gate electrode between the drain and source contact structures. The gate contact structure includes a gate plug and an upper gate plug directly on the gate plug. A center of the gate contact structure overlies only one of the active regions.

11 Claims, 23 Drawing Sheets

(51) Int. Cl.
  *H01L 23/528* (2006.01)
  *H01L 29/417* (2006.01)
  *H01L 29/66* (2006.01)
  *H01L 29/78* (2006.01)
  *H01L 29/45* (2006.01)
  *H01L 29/775* (2006.01)

(52) U.S. Cl.
  CPC .... *H01L 23/5283* (2013.01); *H01L 29/41775* (2013.01); *H01L 29/41791* (2013.01); *H01L 29/6656* (2013.01); *H01L 29/66795* (2013.01); H01L 29/456 (2013.01); *H01L 29/775* (2013.01); *H01L 29/785* (2013.01)

(56) References Cited

U.S. PATENT DOCUMENTS

| | | |
|---|---|---|
| 9,508,818 B1 | 11/2016 | Basket et al. |
| 9,570,450 B1 | 2/2017 | Basker et al. |
| 9,640,625 B2 | 5/2017 | Bouche et al. |
| 2004/0169238 A1 | 9/2004 | Lee et al. |
| 2009/0101982 A1 | 4/2009 | Nagatomo |
| 2013/0119487 A1 | 5/2013 | Lin et al. |
| 2013/0309857 A1 | 11/2013 | Koburger, III et al. |
| 2015/0311082 A1 | 10/2015 | Bouche et al. |
| 2015/0311343 A1 | 10/2015 | Chowdhury et al. |
| 2016/0211363 A1 | 7/2016 | Park |
| 2016/0322304 A1 | 11/2016 | Kim et al. |
| 2016/0359009 A1 | 12/2016 | Xie et al. |
| 2017/0053997 A1 | 2/2017 | Cheng et al. |
| 2017/0125530 A1 | 5/2017 | Zhang et al. |
| 2018/0254246 A1 | 9/2018 | Park et al. |

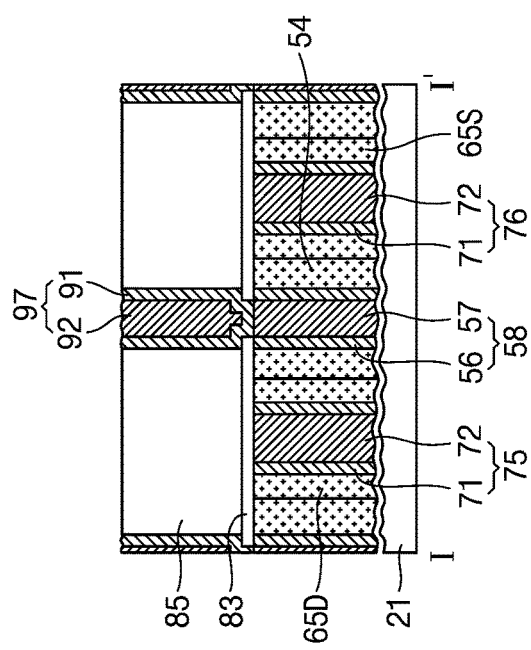
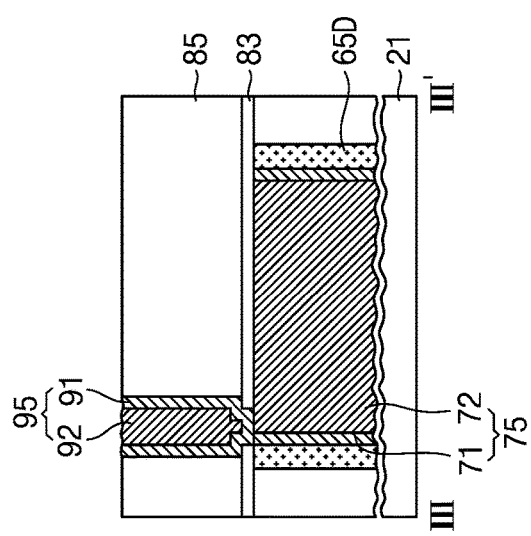
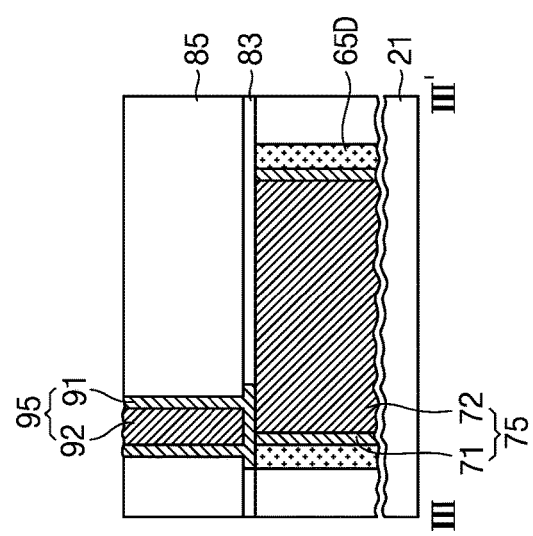
FIG. 10
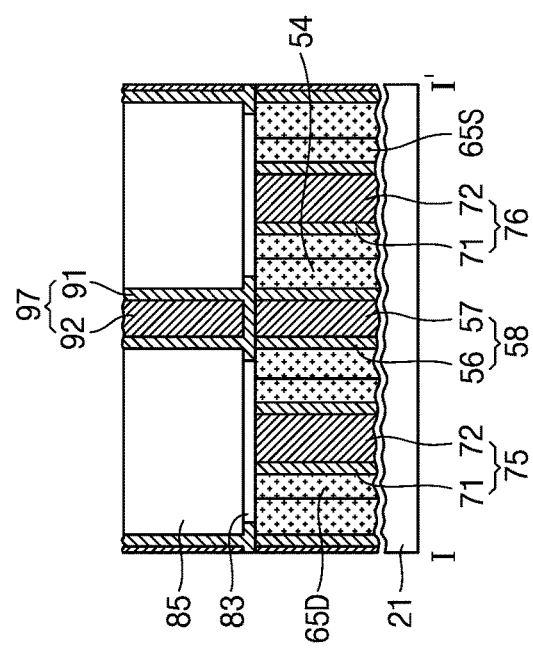
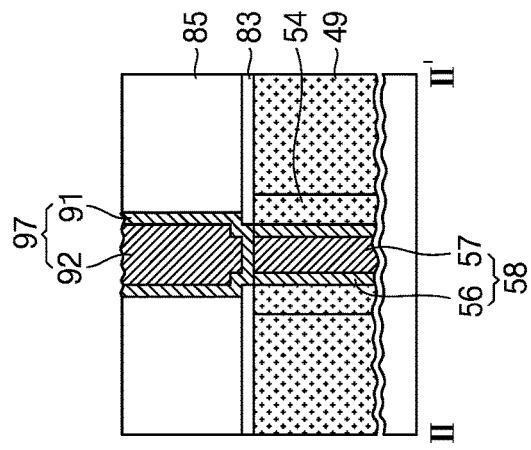
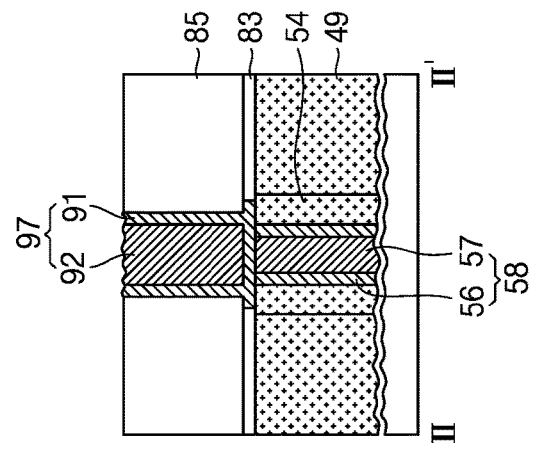
FIG. 11

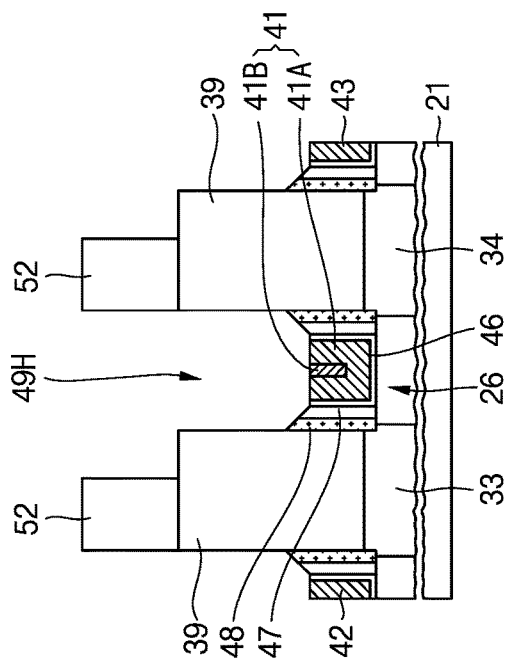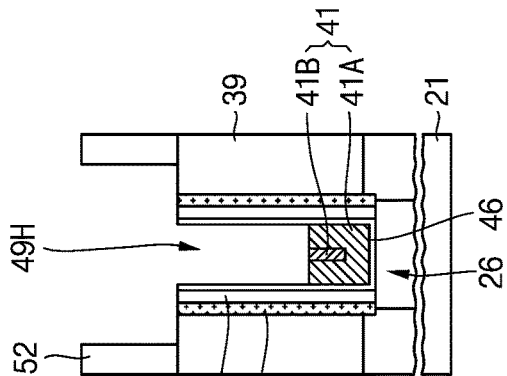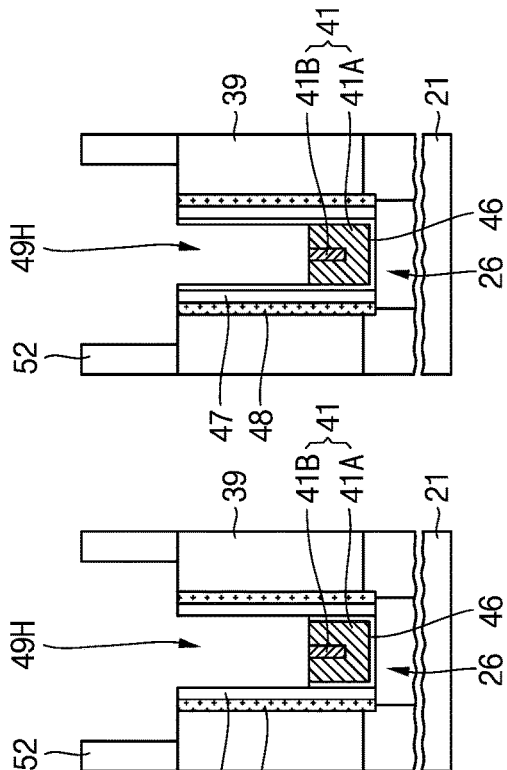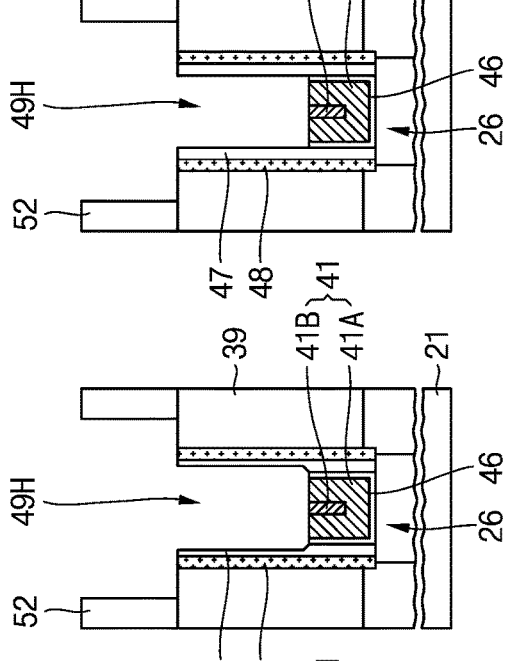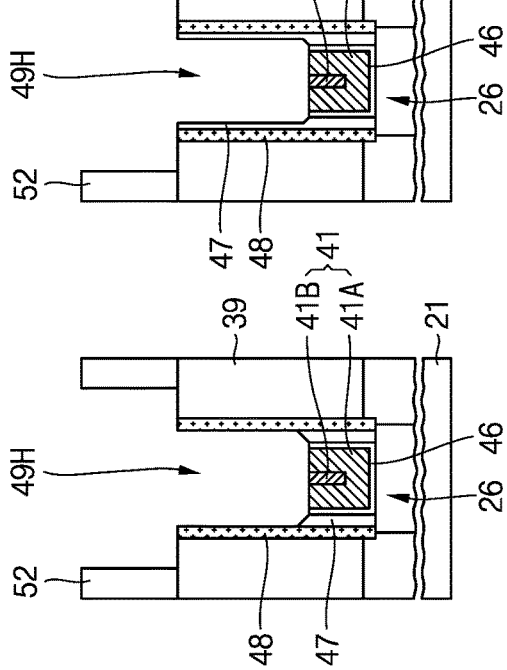

SEMICONDUCTOR DEVICES INCLUDING CONTACT PLUGS

CROSS-REFERENCE TO RELATED APPLICATION

This is a continuation application of U.S. patent application Ser. No. 15/959,783, filed Apr. 23, 2018, which claims priority under 35 U.S.C. § 119 to and the benefit of Korean Patent Application No. 10-2017-0144727, filed on Nov. 1, 2017, in the Korean Intellectual Property Office (KIPO), the entire contents of each of which are incorporated by reference herein in their entireties.

FIELD

The present inventive concept relates to a semiconductor device having a gate contact plug and a drain contact plug and a method of forming the same.

BACKGROUND

Various techniques have been attempted for efficient placement of interconnections in order to increase the degree of integration of semiconductor devices in accordance with the thinning and shortening of electronic devices. The interconnections include a plurality of horizontal interconnections and a plurality of contact plugs connected to the horizontal interconnections. Minimizing the spacing of the plurality of contact plugs is advantageous for high integration of semiconductor devices. The plurality of contact plugs should be insulated from each other. There is a need for a new technique for securing insulation from adjacent contact plugs and minimizing spacing between the contact plugs.

SUMMARY OF THE INVENTION

Some embodiments of the present inventive concept can provide semiconductor devices having contact plugs that are advantageous for high integration. In addition, some embodiments of the present inventive concept can provide methods of forming semiconductor devices having contact plugs that are advantageous for high integration.

A semiconductor device according to some embodiments includes a plurality of active regions spaced apart from each other and extending linearly in parallel on a substrate. A gate electrode crosses the plurality of active regions, and respective drain regions are on and/or in respective ones of the active regions on a first side of the gate electrode and respective source regions are on and/or in respective ones of the active regions on a second side of the gate electrode. A drain plug is disposed on the drain regions and a source plug is disposed on the source regions. A gate plug is disposed on the gate electrode between the drain plug and the source plug such that a straight line passing through a center of the drain plug and a center of the source plug intersects the gate plug.

A semiconductor device according to some embodiments includes a plurality of active regions spaced apart from each other and extending linearly in parallel on a substrate. A gate electrode crosses the plurality of active regions. Respective drain regions are on and/or in respective ones of the active regions on a first side of the gate electrode and respective source regions are on and/or in respective ones of the active regions on a second side of the gate electrode. A drain plug is disposed on the drain regions and a source plug is disposed on the source regions. A gate plug is disposed on the gate electrode between the drain plug and the source plug and has a center overlying one of the active regions.

A semiconductor device according to some embodiments includes an active region on a substrate, a drain region on and/or in the active region, and a source region on and/or in the active region and spaced apart from the drain region. A gate electrode crosses the active region between the drain region and the source region. A drain plug is disposed on the drain region, a source plug is disposed on the source region, and a gate plug is disposed on the gate electrode. A drain contact spacer is on a side surface of the drain plug, a source contact spacer is on a side surface of the source plug, and a gate contact spacer is on a side surface of the gate plug. A center of the gate plug overlies the active region, and the gate contact spacer is in direct contact with the drain contact spacer and the source contact spacer.

Methods of forming a semiconductor device according to some embodiments include forming a plurality of active regions spaced apart from each other and extending linearly in parallel on a substrate and forming a gate electrode crossing the plurality of active regions. Respective drain regions are formed on and/or in respective ones of the active regions on a first side of the gate electrode and respective source regions are formed on and/or in respective ones of the active regions on a second side of the gate electrode. A drain plug is formed on the drain regions, and a source plug is formed on the source regions. A self-aligned gate plug is formed on the gate electrode between the drain plug and the source plug.

BRIEF DESCRIPTION OF THE DRAWINGS

The above and other objects, features and advantages of the present inventive concept will become more apparent to those of ordinary skill in the art by describing exemplary embodiments thereof in detail with reference to the accompanying drawings, in which:

FIGS. 3 to 13 are partial diagrams showing portions of a semiconductor device according to exemplary embodiments of the present inventive concept;

FIGS. 29 to 33 are partial diagrams for illustrating a method of forming a semiconductor device according to exemplary embodiments of the present inventive concept.

DETAILED DESCRIPTION OF EXEMPLARY EMBODIMENTS

Figure 1:
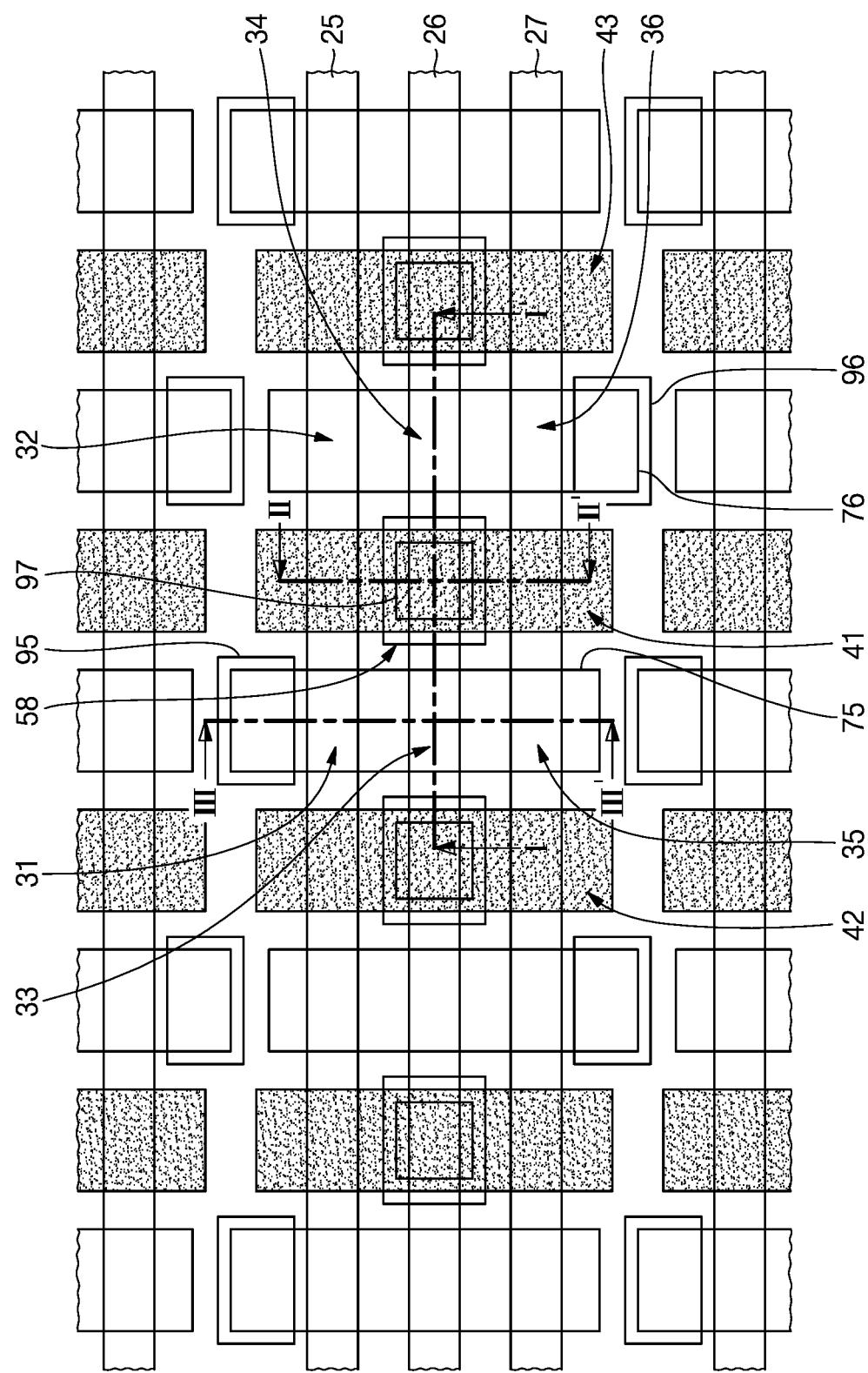
FIG. 1 is a layout for illustrating a semiconductor device according to exemplary embodiments of the present inventive concept.

FIG. 1 is a layout for illustrating a semiconductor device according to exemplary embodiments of the present inventive concept.

Referring to FIG. 1, a semiconductor device according to exemplary embodiments of the present inventive concept may include a plurality of active regions 25, 26, and 27, a plurality of source/drain regions 31, 32, 33, 34, 35, and 36, a plurality of gate electrodes 41, 42, and 43, a plurality of gate contact plugs 58, a plurality of source/drain contact plugs 75 and 76, a plurality of upper source/drain contact plugs 95 and 96, and a plurality of upper gate contact plugs 97.

The plurality of active regions 25, 26, and 27 may include a first active region 25, a second active region 26, and a third active region 27. The first active region 25, the second active region 26, and the third active region 27 may be parallel to each other. The second active region 26 may be formed between the first active region 25 and the third active region 27. Each of the plurality of source/drain regions 31, 32, 33, 34, 35, and 36 may be switched between a drain region and a source region depending on a bias applied thereto. For brevity of description, it is assumed in the following description that the plurality of source/drain regions 31, 32, 33, 34, 35, and 36 are a first drain region 31, a first source region 32, a second drain region 33, a second source region 34, a third drain region 35, and a third source region 36.

The plurality of gate electrodes 41, 42, and 43 may include a first gate electrode 41, a second gate electrode 42, and a third gate electrode 43. The first gate electrode 41 may be formed between the second gate electrode 42 and the third gate electrode 43. The plurality of gate contact plugs 58 may be formed on the plurality of gate electrodes 41, 42, and 43. The plurality of source/drain contact plugs 75 and 76 may include a drain contact plug 75 and a source contact plug 76. One selected from among the plurality of gate contact plugs 58 may be formed between the drain contact plug 75 and the source contact plug 76. Each of the plurality of gate contact plugs 58 may be referred to as a gate plug. The drain contact plug 75 may be referred to as a drain plug, and the source contact plug 76 may be referred to as a source plug.

Each of the plurality of upper source/drain contact plugs 95 and 96 may correspond to a source/drain via plug. The plurality of upper source/drain contact plugs 95 and 96 may include an upper drain contact plug 95 and an upper source contact plug 96. Each of the plurality of upper gate contact plugs 97 may correspond to a gate via plug. The plurality of upper gate contact plugs 97 may be formed on the plurality of gate contact plugs 58. Each of the plurality of upper gate contact plugs 97 may be referred to as an upper gate plug. The upper drain contact plug 95 may be referred to as an upper drain plug, and the upper source contact plug 96 may be referred to as an upper source plug.

The upper drain contact plug 95 may be formed closer to the first active region 25, and the upper source contact plug 96 may be formed closer to the third active region 27. The upper drain contact plug 95 may be formed closer to the first drain region 31, and the upper source contact plug 96 may be formed closer to the third source region 36. In an embodiment, a straight line passing through the center of the upper drain contact plug 95 and the center of the upper source contact plug 96 may overlap one selected from among the plurality of upper gate contact plugs 97. The straight line passing through the center of the upper drain contact plug 95 and the center of the upper source contact plug 96 may pass through the center of one selected from among the plurality of upper gate contact plugs 97. The straight line passing through the center of the upper drain contact plug 95 and the center of the upper source contact plug 96 may be obliquely aligned with respect to a long axis direction of the first gate electrode 41.

Figure 2:
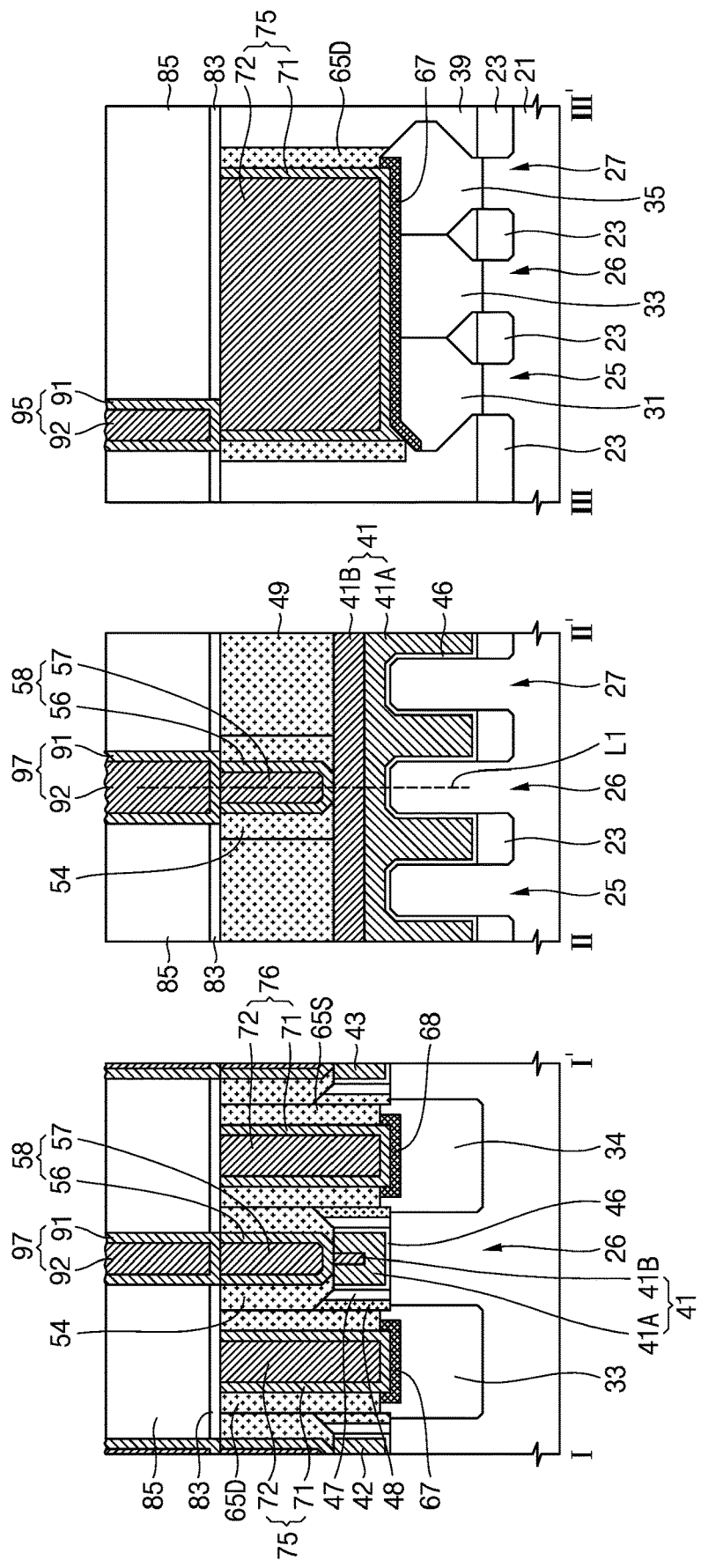
FIG. 2 shows sectional views taken along lines I-I', II-II', and III-III' in order to illustrate a semiconductor device according to exemplary embodiments of the present inventive concept.

FIG. 2 shows sectional views taken along lines I-I', II-II', and III-III' in order to illustrate a semiconductor device according to exemplary embodiments of the present inventive concept.

Referring to FIGS. 1 and 2, an element separation layer 23, the plurality of active regions 25, 26, and 27, the plurality of source/drain regions 31, 32, 33, 34, 35, and 36, an interlayer insulation layer 39, the plurality of gate electrodes 41, 42, and 43, a gate dielectric layer 46, a plurality of gate spacers 47 and 48, a gate capping layer 49, a gate contact spacer 54, the plurality of gate contact plugs 58, a drain contact spacer 65D, a source contact spacer 65S, metal silicide layers 67 and 68, the plurality of source/drain contact plugs 75 and 76, an etch stop layer 83, an upper insulation layer 85, the plurality of upper source/drain contact plugs 95 and 96, and the plurality of upper gate contact plugs 97 may be formed on a substrate 21.

Each of the plurality of gate electrodes 41, 42, and 43 may include a first conductive layer 41A and a second conductive layer 41B. The plurality of gate spacers 47 and 48 may include a first gate spacer 47 and a second gate spacer 48. Each of the gate contact plugs 58 may include a first barrier layer 56 and a gate contact conductive layer 57. Each of the plurality of source/drain contact plugs 75 and 76 may include a second barrier layer 71 and a source/drain contact conductive layer 72. Each of the plurality of upper source/drain contact plugs 95 and 96 and the plurality of upper gate contact plugs 97 may include a third barrier layer 91 and an upper contact conductive layer 92.

The plurality of active regions 25, 26, and 27 may have upper portions protruding from, and thus disposed at a higher level than, the element separation layer 23. Each of the plurality of active regions 25, 26, and 27 may be formed in the shape of a fin. Each of the plurality of active regions 25, 26, and 27 may be referred to as a fin active region. The plurality of active regions 25, 26, and 27 may be formed to be parallel to each other.

The plurality of source/drain regions 31, 32, 33, 34, 35, and 36 may be formed in the plurality of active regions 25, 26, and 27. The first drain region 31, the second drain region 33, and the third drain region 35 may be spaced apart from the first source region 32, the second source region 34, and the third source region 36. The plurality of source/drain regions 31, 32, 33, 34, 35, and 36 may have upper portions protruding from, and thus disposed at a higher level than, the upper portions of the plurality of active regions 25, 26, and 27. The plurality of source/drain regions 31, 32, 33, 34, 35, and 36 may have greater horizontal widths than the plurality of active regions 25, 26, and 27. Each of the plurality of source/drain regions 31, 32, 33, 34, 35, and 36 may have a greater horizontal width than each of the plurality of active regions 25, 26, and 27. The first drain region 31, the second drain region 33, and the third drain region 35 may be brought into contact with each other at side surfaces thereof. The first source region 32, the second source region 34, and the third source region 36 may be brought into contact with each other at side surfaces thereof. Each of the plurality of source/drain regions 31, 32, 33, 34, 35, and 36 may have a cross section formed in the shape of a letter "U."

The plurality of gate electrodes 41, 42, and 43 may cross the plurality of active regions 25, 26, and 27, which are disposed between the plurality of source/drain regions 31, 32, 33, 34, 35, and 36. The gate dielectric layer 46 may be formed between the plurality of active regions 25, 26, and 27 and the plurality of gate electrodes 41, 42, and 43. The gate dielectric layer 46 may surround side surfaces and bottom surfaces of the plurality of gate electrodes 41, 42, and 43. In an embodiment, the first gate electrode 41 may cross the first active region 25 disposed between the first drain region 31 and the first source region 32, cross the second active region 26 disposed between the second drain region 33 and the second source region 34, and cross the third active region 27 disposed between the third drain region 35 and the third source region 36. The plurality of gate electrodes 41, 42, and 43 may have low portions formed at a lower level than the upper portions of the plurality of active regions 25, 26, and 27. The plurality of gate electrodes 41, 42, and 43 may cover top surfaces and side surfaces of the plurality of active regions 25, 26, and 27.

The plurality of gate spacers 47 and 48 may be formed on the side surfaces of the plurality of gate electrodes 41, 42, and 43. The first gate spacer 47 may be formed between the second gate spacer 48 and the plurality of gate electrodes 41, 42, and 43. The gate dielectric layer 46 may be preserved between the first gate spacer 47 and the plurality of gate electrodes 41, 42, and 43. In an embodiment, the first gate spacer 47 may correspond to an inner spacer, and the second gate spacer 48 may correspond to an outer spacer.

The gate capping layer 49 may cover the plurality of gate electrodes 41, 42, and 43. Each of the gate contact plugs 58 may pass through the gate capping layer 49 and may be aligned on the plurality of gate electrodes 41, 42, and 43. Each of the gate contact plugs 58 may be aligned adjacent to the centers of the plurality of active regions 25, 26, and 27. A first straight line L1, which passes through the center of one selected from among the gate contact plugs 58 and is perpendicular to a surface of the substrate 21, may overlap one selected from among the plurality of active regions 25, 26, and 27. In an embodiment, the one selected from among the gate contact plugs 58 may be aligned on the second active region 26. The first straight line L1, which passes through the center of the one selected from among the gate contact plugs 58 and is perpendicular to the surface of the substrate 21, may overlap the second active region 26. The gate contact spacer 54 may be formed to surround side surfaces of the gate contact plugs 58.

The metal silicide layers 67 and 68 may be formed on the plurality of source/drain regions 31, 32, 33, 34, 35, and 36. The plurality of source/drain contact plugs 75 and 76 may be connected to the metal silicide layers 67 and 68 through the interlayer insulation layer 39. The drain contact spacer 65D may be formed to surround a side surface of the drain contact plug 75. The source contact spacer 65S may be formed to surround a side surface of the source contact plug 76. In an embodiment, each of the drain contact spacer 65D and the source contact spacer 65S may be brought into contact with the gate contact spacer 54 and the second gate spacer 48. The interlayer insulation layer 39, the gate capping layer 49, the gate contact spacer 54, the gate contact plugs 58, the drain contact spacer 65D, the source contact spacer 65S, and the plurality of source/drain contact plugs 75 and 76 may have substantially coplanar upper surfaces.

The plurality of upper gate contact plugs 97 may be brought into contact with the gate contact plugs 58 through the upper insulation layer 85 and the etch stop layer 83. The upper drain contact plug 95 may be brought into contact with the drain contact plug 75 through the upper insulation layer 85 and the etch stop layer 83, and the upper source contact plug 96 may be brought into contact with the source contact plug 76 through the upper insulation layer 85 and the etch stop layer 83. The plurality of upper source/drain contact plugs 95 and 96 and the plurality of upper gate contact plugs 97 may have upper portions formed at different levels, but this will be omitted for convenience of description.

FIGS. 3 to 13 are partial diagrams showing portions of a semiconductor device according to exemplary embodiments of the present inventive concept.

Figure 3:
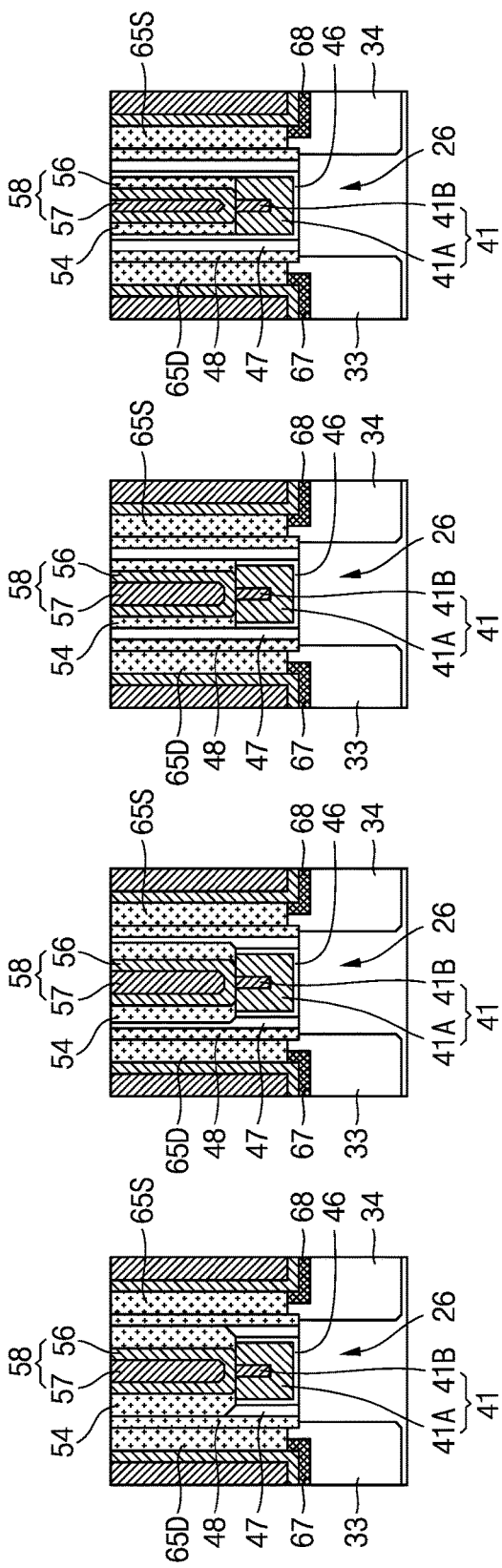

Referring to FIG. 3, the second gate spacer 48 may extend between the drain contact spacer 65D and the gate contact spacer 54 and between the source contact spacer 65S and the gate contact spacer 54. The first gate spacer 47 may have an upper portion formed at a lower level than that of the second gate spacer 48. The second gate spacer 48, the gate contact spacer 54, the gate contact plug 58, the drain contact spacer 65D, and the source contact spacer 65S may have substantially coplanar upper surfaces.

Figure 4:
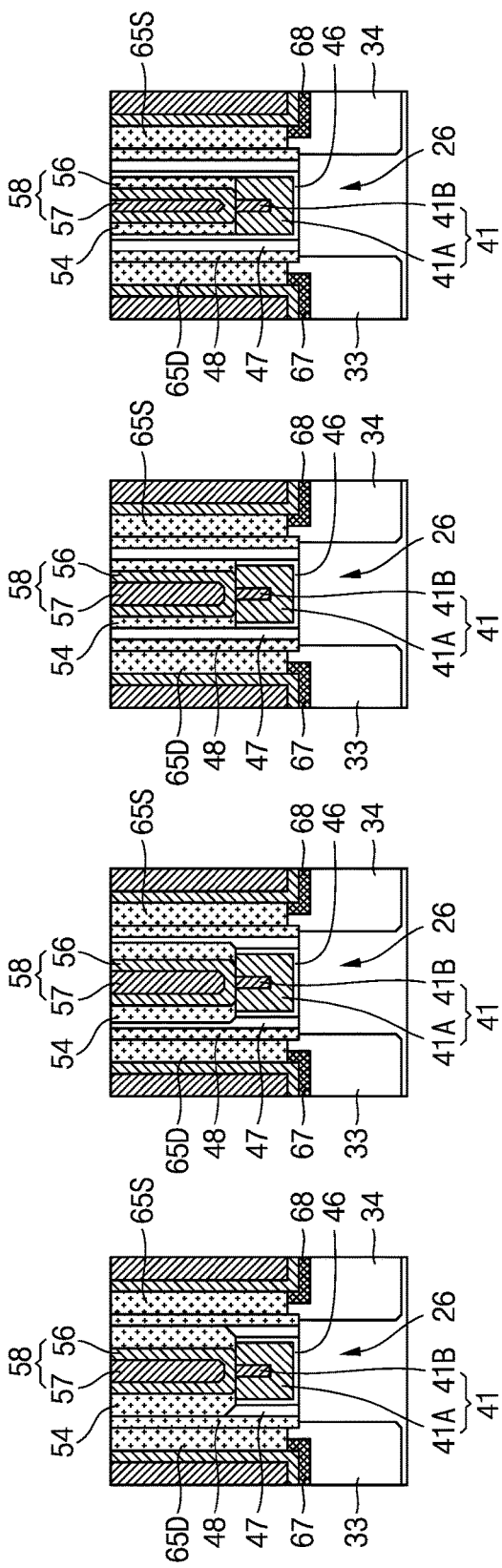

Referring to FIG. 4, the first gate spacer 47 may have a lower region formed between the first gate electrode 41 and the second gate spacer 48 and have an upper region extending between the second gate spacer 48 and the gate contact spacer 54. The upper region of the first gate spacer 47 may have a smaller thickness than the lower region of the first gate spacer 47. The gate dielectric layer 46 may have an upper portion formed at a lower level than that of the first gate spacer 47. The first gate spacer 47, the second gate spacer 48, the gate contact spacer 54, the gate contact plug 58, the drain contact spacer 65D, and the source contact spacer 65S may have substantially coplanar upper surfaces.

Figure 5:
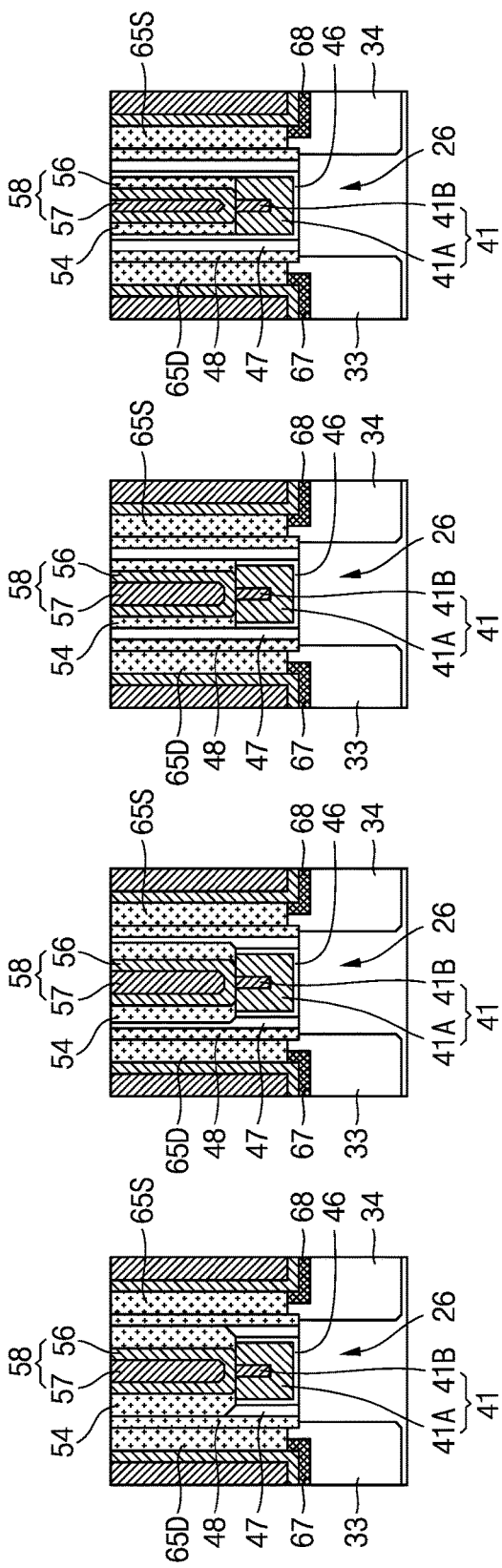

Referring to FIG. 5, the first gate spacer 47 may extend between the second gate spacer 48 and the gate contact spacer 54. The first gate spacer 47, the second gate spacer 48, the gate contact spacer 54, the gate contact plug 58, the drain contact spacer 65D, and the source contact spacer 65S may have substantially coplanar upper surfaces.

Figure 6:
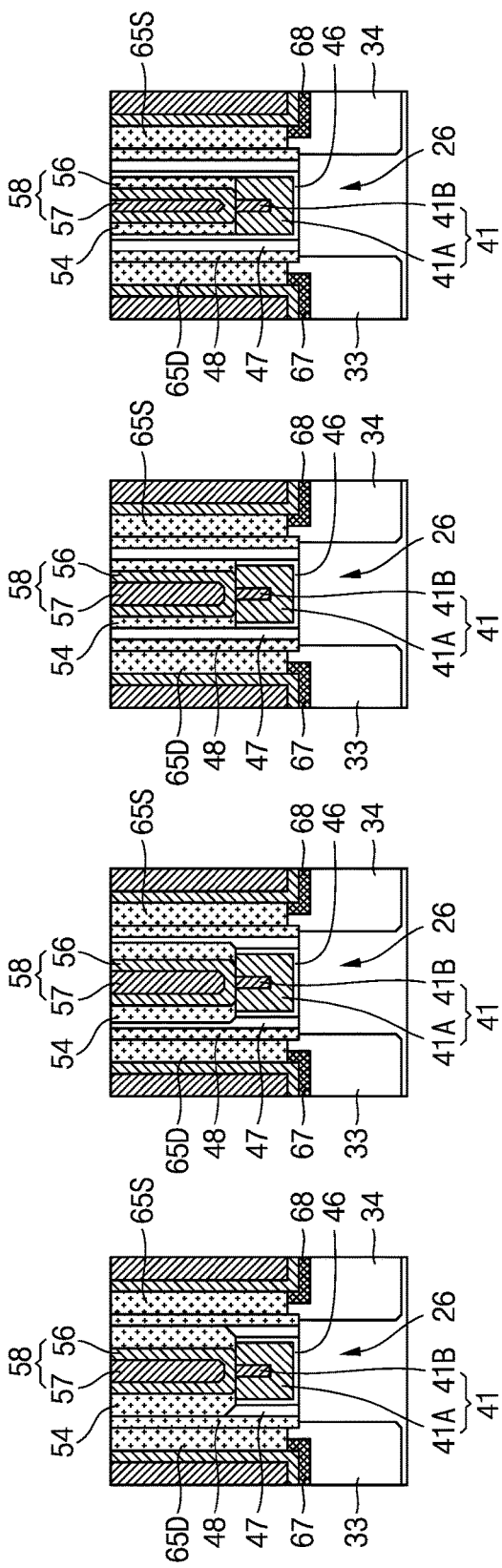

Referring to FIG. 6, the gate dielectric layer 46 may extend between the first gate spacer 47 and the gate contact spacer 54. The first gate spacer 47, the second gate spacer 48, the gate contact spacer 54, the gate contact plug 58, the drain contact spacer 65D, and the source contact spacer 65S may have substantially coplanar upper surfaces.

Figure 7:
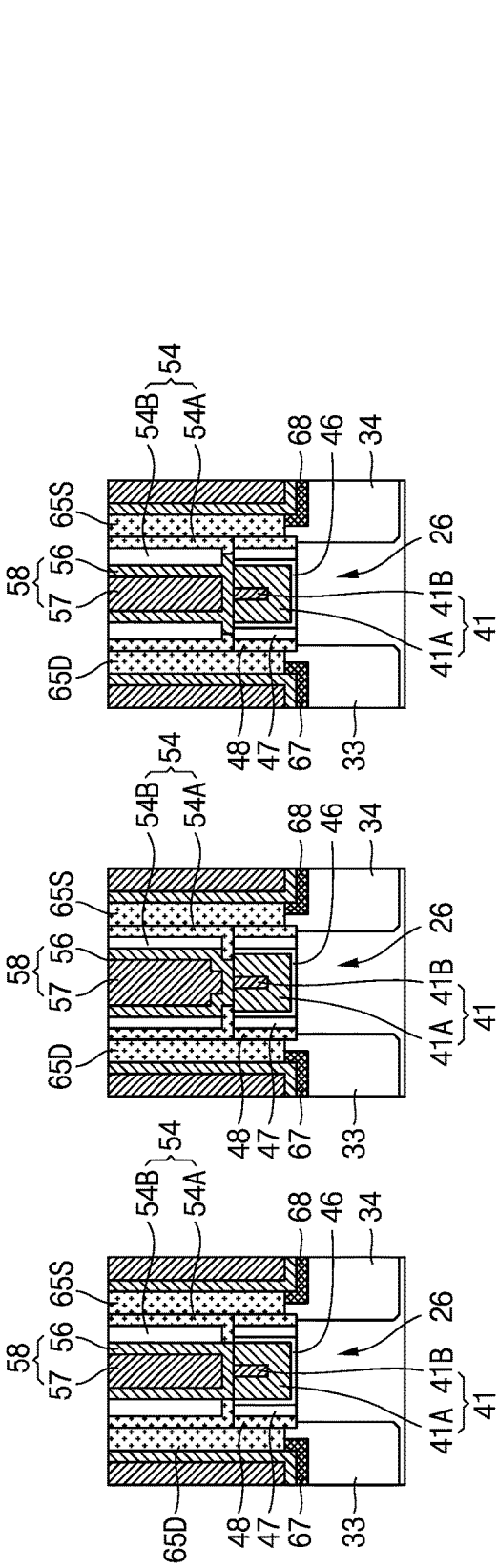

Referring to FIG. 7, the gate contact spacer 54 may include a first gate contact spacer 54A and a second gate contact spacer 54B. The second gate contact spacer 54B may be formed between the gate contact plug 58 and the first gate contact spacer 54A. The first gate contact spacer 54A may have a lower region with a greater horizontal width than an upper region. The first gate contact spacer 54A may be formed in the shape of a letter "L." The first gate contact spacer 54A may be brought into contact with a side surface and a bottom surface of the second gate contact spacer 54B.

Figure 8:
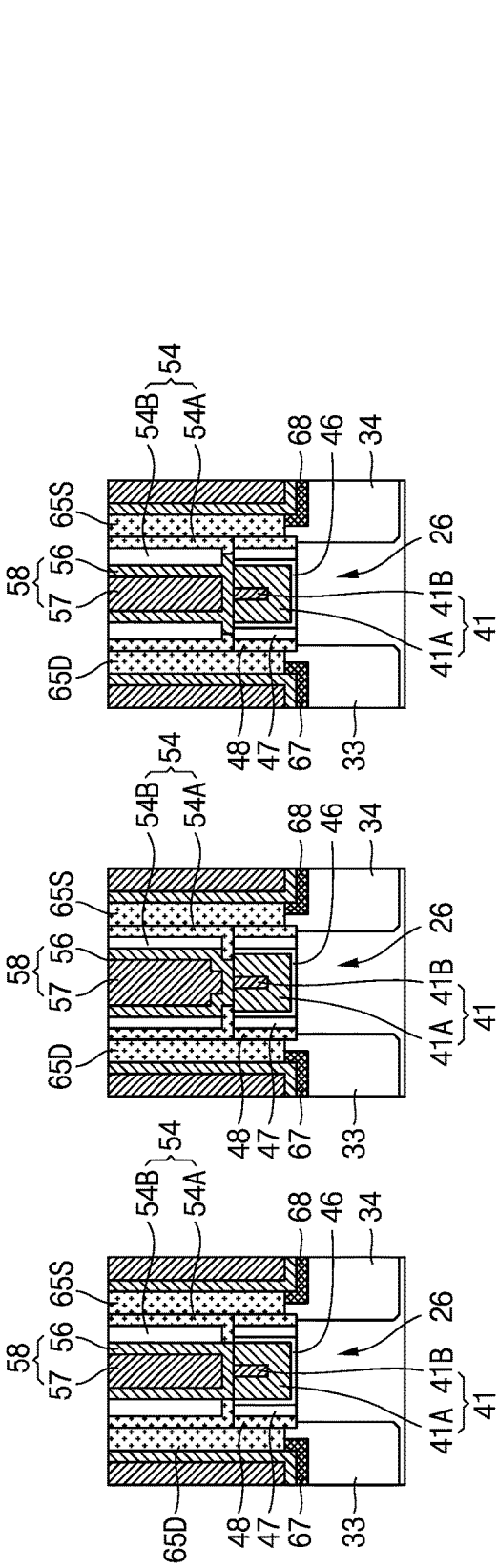

Referring to FIG. 8, the lower region of the first gate contact spacer 54A may horizontally protrude toward the center of the gate contact plug 58. The lower region of the first gate contact spacer 54A may be offset from the side surface of the second gate contact spacer 54B. The lower region of the first gate contact spacer 54A and the side surface of the second gate contact spacer 54B may form a step shape.

Figure 9:
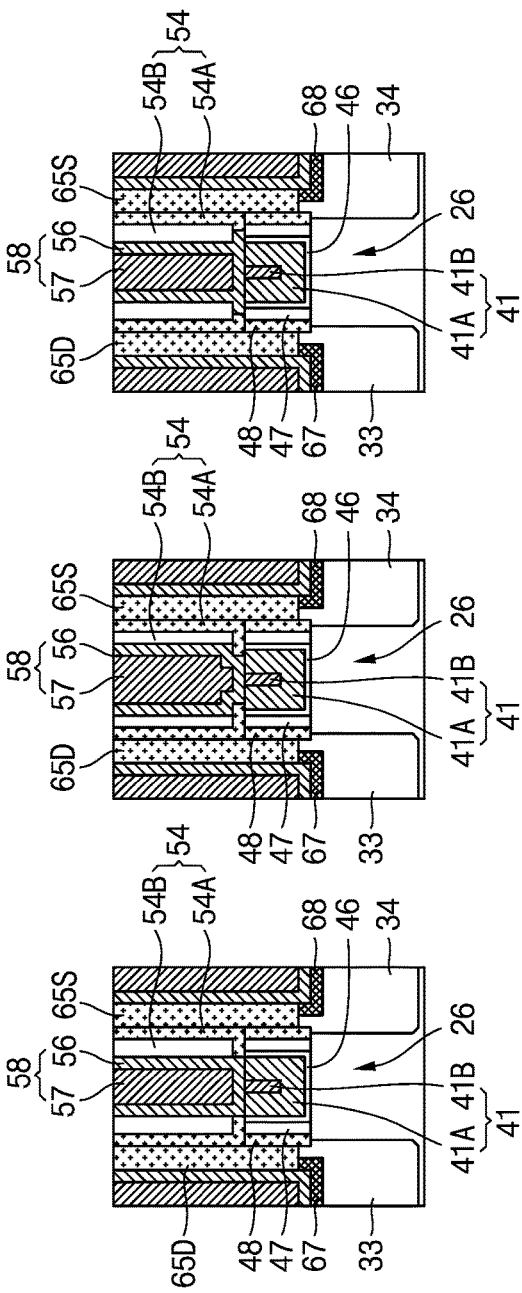

Referring to FIG. 9, an undercut region may be formed under the second gate contact spacer 54B. The gate contact plug 58 may extend under the second gate contact spacer 54B. The gate contact plug 58 may be brought into direct contact with the side surface and the lower portion of the second gate contact spacer 54B and may be brought into direct contact with the lower region of the first gate contact spacer 54A.

Referring to FIG. 10, the etch stop layer 83 may horizontally protrude toward the centers of the upper source/drain contact plugs 95 and 96 and the upper gate contact plug 97. A side surface of the etch stop layer 83 may be offset from a side surface of the upper insulation layer 85. The upper source/drain contact plugs 95 and 96 and the upper gate contact plug 97 may be brought into direct contact with a side surface and an upper surface of the etch stop layer 83.

Referring to FIG. 11, an undercut region may be formed under the upper insulation layer 85. The upper source/drain contact plugs 95 and 96 and the upper gate contact plug 97 may extend under the upper insulation layer 85. The upper source/drain contact plugs 95 and 96 and the upper gate contact plug 97 may be brought into direct contact with a lower surface of the upper insulation layer 85 and with a side surface of the etch stop layer 83.

Figure 12:
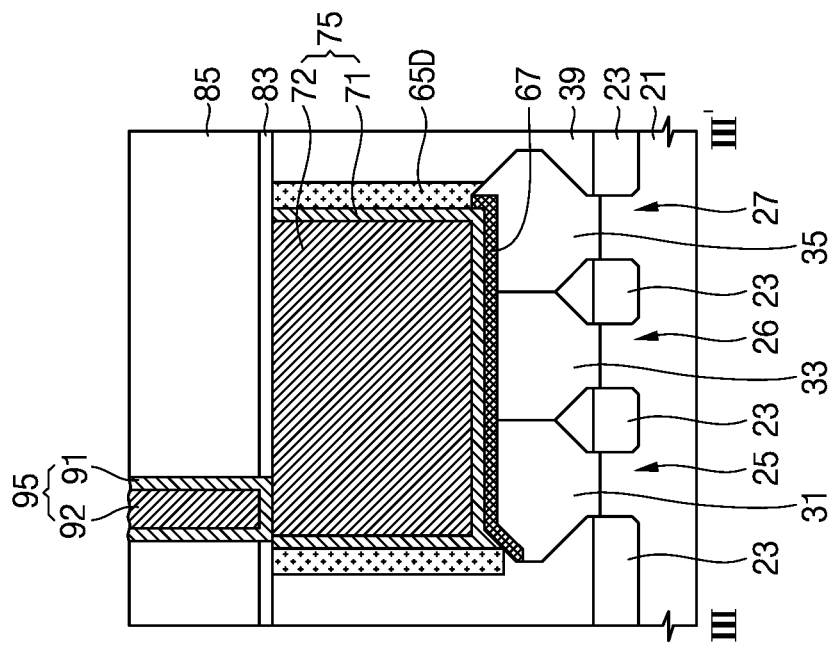

Referring to FIG. 12, the upper drain contact plug 95 may be aligned adjacent to the first active region 25. A straight line that passes through the center of the upper drain contact plug 95 and is perpendicular to the surface of the substrate 21 may be aligned outside the plurality of active regions 25, 26, and 27. The straight line that passes through the center of the upper drain contact plug 95 and is perpendicular to the surface of the substrate 21 may be aligned outside the first active region 25.

Figure 13:
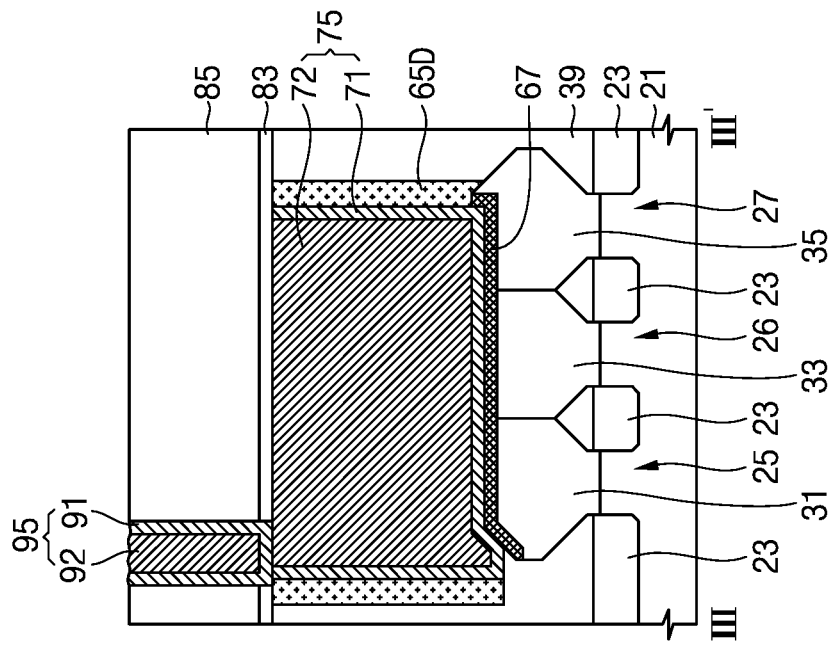

Referring to FIG. 13, the straight line that passes through the center of the upper drain contact plug 95 and is perpendicular to the surface of the substrate 21 may be aligned inside the plurality of active regions 25, 26, and 27. The straight line that passes through the center of the upper drain contact plug 95 and is perpendicular to the surface of the substrate 21 may be aligned inside the first active region 25.

Figure 14:
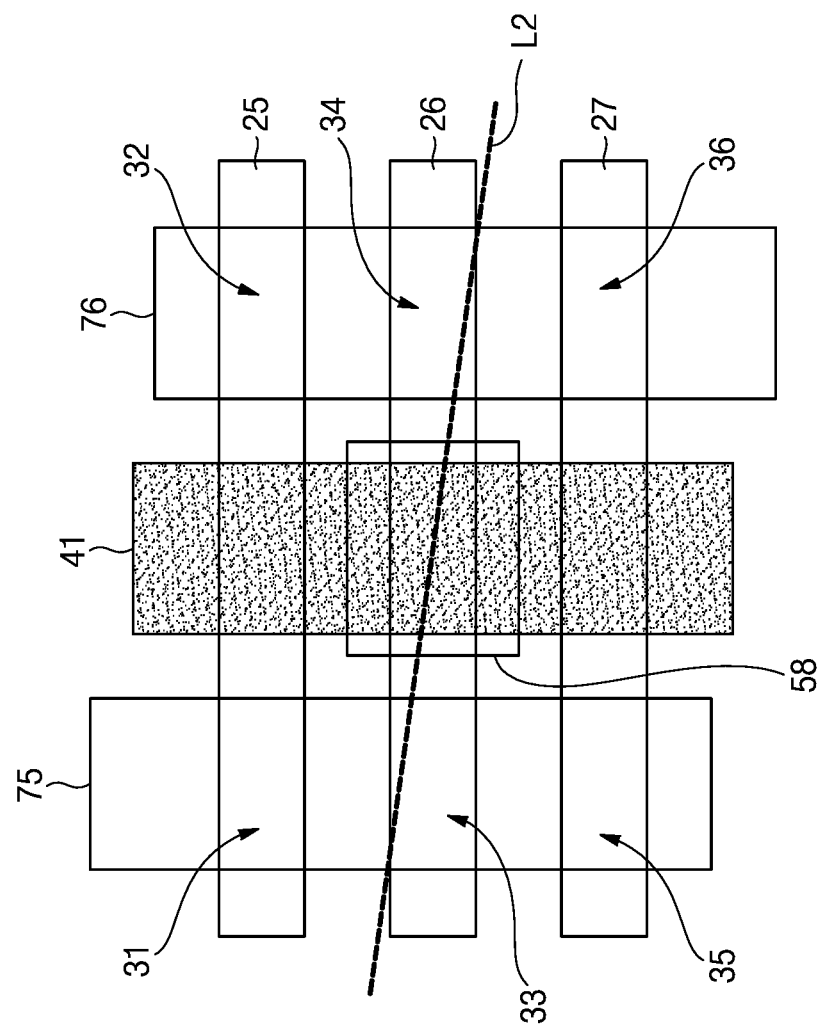
FIG. 14 is a partial layout showing a portion of FIG. 1 in order to illustrate a semiconductor device according to exemplary embodiments of the present inventive concept.

FIG. 14 is a partial layout showing a portion of FIG. 1 in order to illustrate a semiconductor device according to exemplary embodiments of the present inventive concept.

Referring to FIG. 14, a second straight line L2, which passes through the center of the drain contact plug 75 and the center of the source contact plug 76, may intersect or overlap the gate contact plug 58. The center of the gate contact plug 58 may overlap over the second active region 26.

Figure 15:
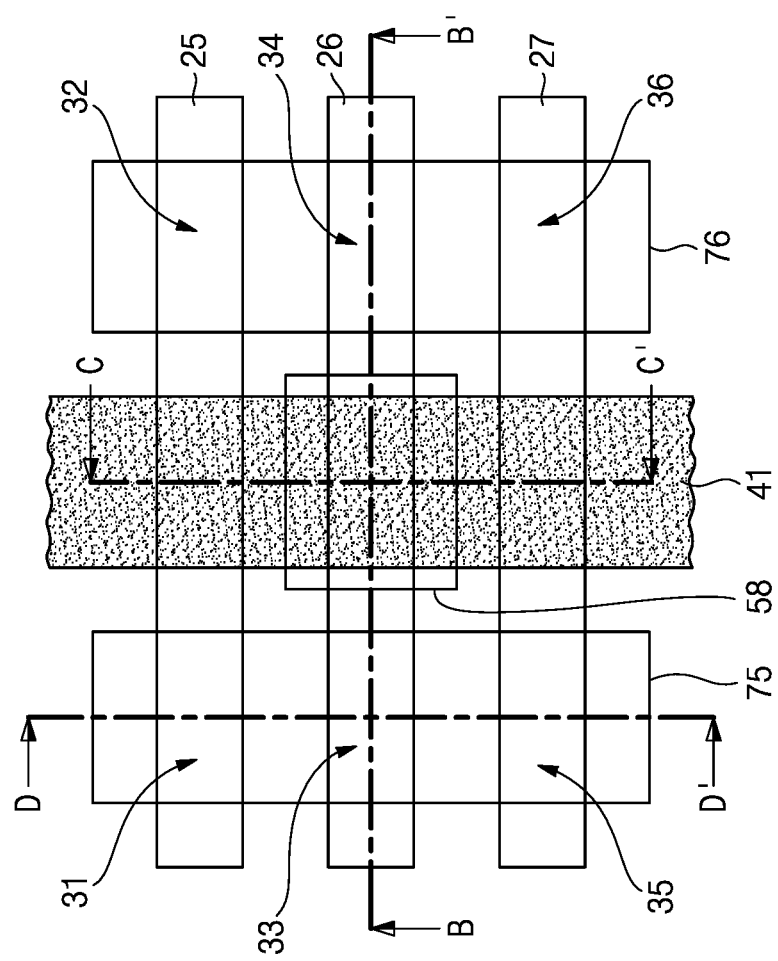
FIG. 15 is a layout for illustrating a semiconductor device according to exemplary embodiments of the present inventive concept.

FIG. 15 is a layout for illustrating a semiconductor device according to exemplary embodiments of the present inventive concept.

Referring to FIG. 15, a semiconductor device according to exemplary embodiments of the present inventive concept may include a plurality of active regions 25, 26, and 27, a plurality of source/drain regions 31, 32, 33, 34, 35, and 36, a gate electrode 41, a gate contact plug 58, a drain contact plug 75, and a source contact plug 76. The plurality of active regions 25, 26, and 27 may include a first active region 25, a second active region 26, and a third active region 27. The plurality of source/drain regions 31, 32, 33, 34, 35, and 36 may include a first drain region 31, a first source region 32, a second drain region 33, a second source region 34, a third drain region 35, and a third source region 36. The gate electrode 41 may cross the plurality of active regions 25, 26, and 27, which are disposed between the plurality of source/drain regions 31, 32, 33, 34, 35, and 36. The gate contact plug 58 may be formed on the gate electrode 41. The gate contact plug 58 may be formed between the drain contact plug 75 and the source contact plug 76.

Figure 16:
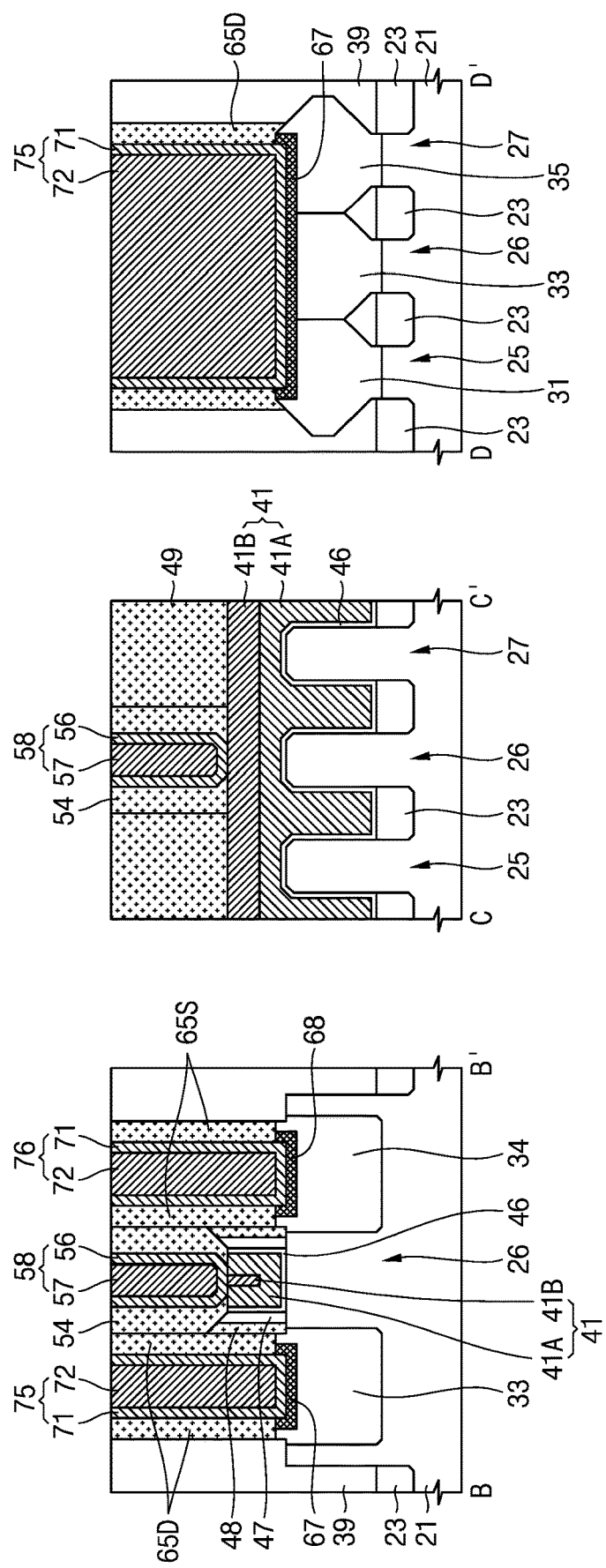
FIG. 16 shows sectional views taken along lines B-B', C-C', and D-D' in order to illustrate a semiconductor device according to exemplary embodiments of the present inventive concept.

FIG. 16 shows sectional views taken along lines B-B', C-C', and D-D' in order to illustrate a semiconductor device according to exemplary embodiments of the present inventive concept.

Referring to FIGS. 15 and 16, an element separation layer 23, the plurality of active regions 25, 26, and 27, the plurality of source/drain regions 31, 32, 33, 34, 35, and 36, an interlayer insulation layer 39, the gate electrode 41, a gate dielectric layer 46, a plurality of gate spacers 47 and 48, a gate capping layer 49, a gate contact spacer 54, the gate contact plug 58, a drain contact spacer 65D, a source contact spacer 65S, metal silicide layers 67 and 68, the drain contact plug 75, and the source contact plug 76 may be formed on a substrate 21. The interlayer insulation layer 39, the gate capping layer 49, the gate contact spacer 54, the gate contact plugs 58, the drain contact spacer 65D, the source contact spacer 65S, the drain contact plug 75, and the source contact plug 76 may have substantially coplanar upper surfaces.

Figure 17:
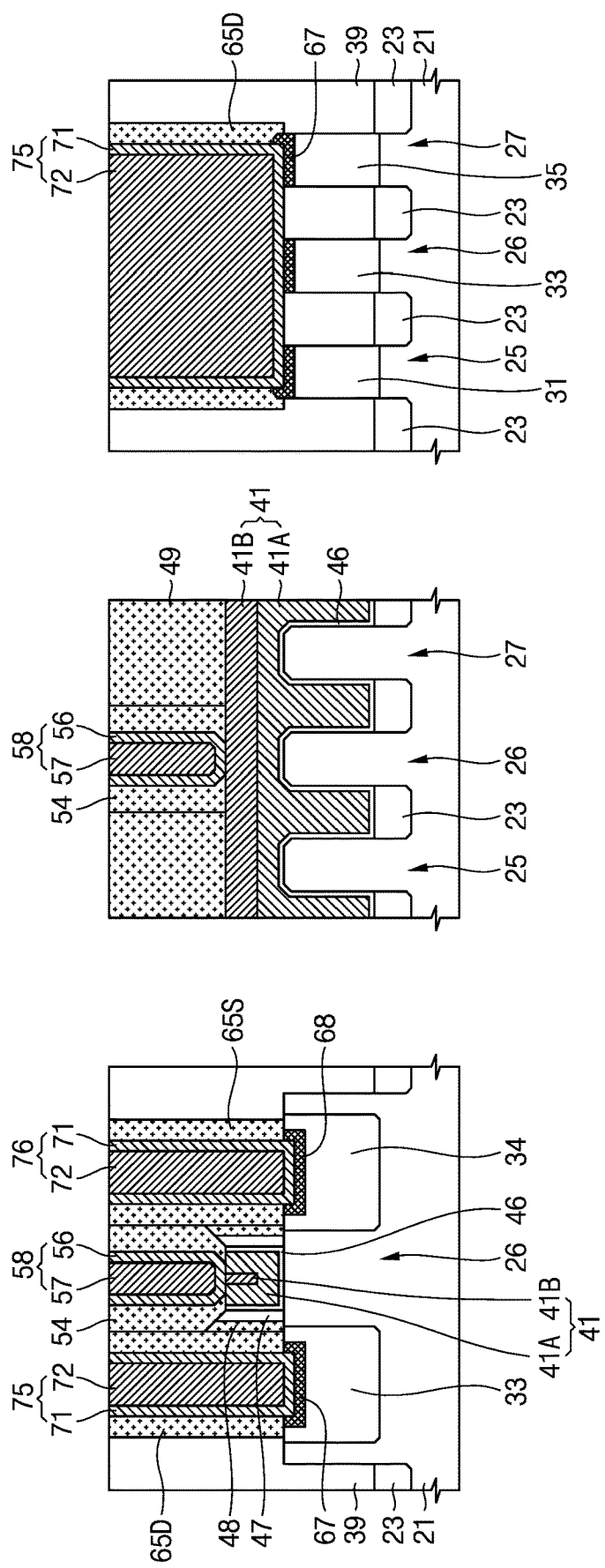
FIGS. 17 and 18 show sectional views for illustrating a semiconductor device according to exemplary embodiments of the present inventive concept.
Figure 18:
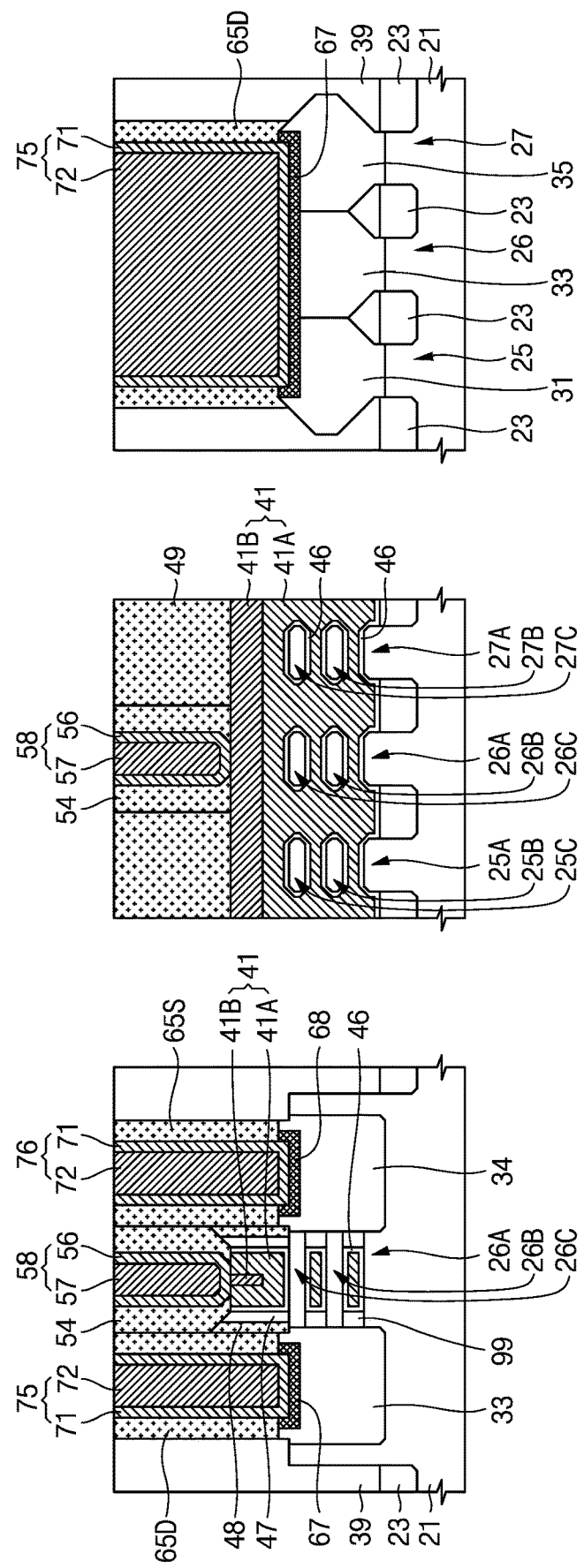

FIGS. 17 and 18 show sectional views for illustrating a semiconductor device according to exemplary embodiments of the present inventive concept.

Referring to FIG. 17, a first drain region 31, a second drain region 33, and a third drain region 35 may be spaced apart from each other. The drain contact plug 75 may be formed on the first drain region 31, the second drain region 33, and the third drain region 35. The drain contact plug 75 may be electrically connected to the first drain region 31, the second drain region 33, and the third drain region 35. A first source region 32, a second source region 34, and a third source region 36 may be spaced apart from each other. The source contact plug 76 may be formed on the first source region 32, the second source region 34, and the third source region 36. The source contact plug 76 may be electrically connected to the first source region 32, the second source region 34, and the third source region 36.

Referring to FIG. 18, a first active region 25 may include a first lower active region 25A connected to the substrate 21, a first middle active region 25B formed on the first lower active region 25A, and a first upper active region 25C formed on the first middle active region 25B. A second active region 26 may include a second lower active region 26A connected to the substrate 21, a second middle active region 26B formed on the second lower active region 26A, and a second upper active region 26C formed on the second middle active region 26B. A third active region 27 may include a third lower active region 27A connected to the substrate 21, a third middle active region 27B formed on the third lower active region 27A, and a third upper active region 27C formed on the third middle active region 27B. Each of the first middle active region 25B, the first upper active region 25C, the second middle active region 26B, the second upper active region 26C, the third middle active region 27B, and the third upper active region 27C may be formed in various shapes such as a nanowire, a trapezoid, a quadrangle, an ellipse, or a combination thereof.

The gate electrode 41 may extend between the first lower active region 25A, the first middle active region 25B, the first upper active region 25C, the second lower active region 26A, the second middle active region 26B, the second upper active region 26C, the third lower active region 27A, the third middle active region 27B, and the third upper active region 27C. The gate dielectric layer 46 may be formed between the gate electrode 41 and the first lower active region 25A, the first middle active region 25B, the first upper active region 25C, the second lower active region 26A, the second middle active region 26B, the second upper active region 26C, the third lower active region 27A, the third middle active region 27B, and the third upper active region 27C.

Each of the first lower active region 25A, the first middle active region 25B, the first upper active region 25C, the second lower active region 26A, the second middle active region 26B, the second upper active region 26C, the third lower active region 27A, the third middle active region 27B, and the third upper active region 27C may be brought into contact with one selected from among the first drain region 31, the second drain region 33, and the third drain region 35 and may be brought into contact with one selected from among the first source region 32, the second source region 34, and the third source region 36. For example, each of the second lower active region 26A, the second middle active region 26B, and the second upper active region 26C may be brought into direct contact with the second drain region 33 and the second source region 34.

Insulation plugs 99 may be formed between the gate electrode 41 and the plurality of source/drain regions 31, 32, 33, 34, 35, and 36. The insulation plugs 99 may be brought into contact with the plurality of source/drain regions 31, 32, 33, 34, 35, and 36 between the first lower active region 25A, the first middle active region 25B, the first upper active region 25C, the second lower active region 26A, the second middle active region 26B, the second upper active region 26C, the third lower active region 27A, the third middle active region 27B, and the third upper active region 27C. For example, the insulation plugs 99 brought into contact with the second drain region 33 and the second source region 34 may be formed between the second lower active region 26A and the second middle active region 26B and between the second middle active region 26B and the second upper active region 26C. The gate dielectric layer 46 may be interposed between the gate electrode 41 and the insulation plugs 99.

FIGS. 19 to 28 show sectional views taken along lines I-I', II-II', and III-III' of FIG. 1 in order to illustrate a method of forming a semiconductor device according to exemplary embodiments of the present inventive concept.

Figure 19:
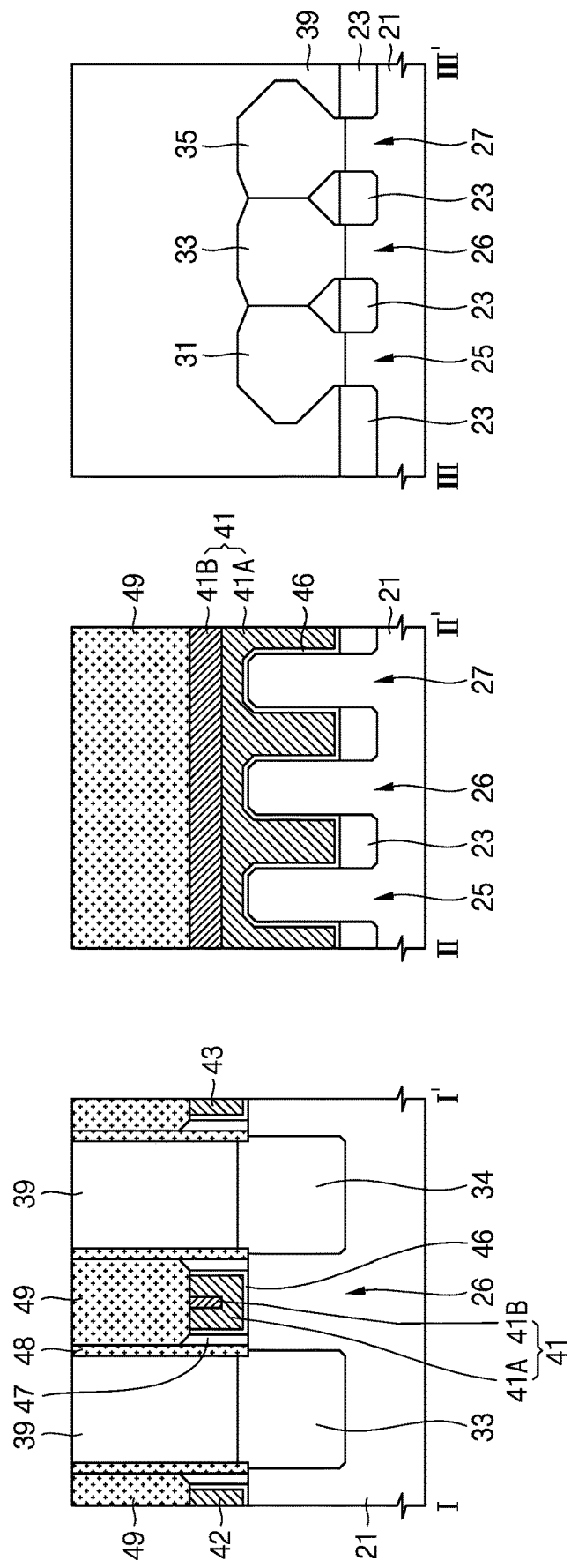
FIGS. 19 to 28 show sectional views taken along lines I-I', II-II', and III-III' of FIG. 1 in order to illustrate a method of forming a semiconductor device according to exemplary embodiments of the present inventive concept.

Referring to FIGS. 1 and 19, an element separation layer 23, a plurality of active regions 25, 26, and 27, a plurality of source/drain regions 31, 32, 33, 34, 35, and 36, an interlayer insulation layer 39, a plurality of gate electrodes 41, 42, and 43, a gate dielectric layer 46, a plurality of gate spacers 47 and 48, and a gate capping layer 49 may be included on a substrate 21.

The substrate 21 may include a semiconductor substrate such as a single-crystal silicon wafer or a silicon-on-insulator (SOI) wafer. An N-well or a P-well may be formed in the substrate 21, but will be omitted for convenience of description. The element separation layer 23 may be formed in the substrate 21 by using shallow trench isolation (STI) technology. The element separation layer 23 may contain a silicon oxide, a silicon nitride, a silicon oxynitride, or a combination thereof. The plurality of active regions 25, 26, and 27 may be limited by the element separation layer 23. The plurality of active regions 25, 26, and 27 may have upper portions protruding from, and thus disposed at a higher level than, the element separation layer 23. The plurality of active regions 25, 26, and 27 may include a first active region 25, a second active region 26, and a third active region 27.

The plurality of source/drain regions 31, 32, 33, 34, 35, and 36 may include a first drain region 31, a first source region 32, a second drain region 33, a second source region 34, a third drain region 35, and a third source region 36. A process of forming the plurality of source/drain regions 31, 32, 33, 34, 35, and 36 may include forming trenches by partially removing the plurality of active regions 25, 26, and 27 and forming a selective epitaxial growth (SEG) layer in the trenches. The plurality of source/drain regions 31, 32, 33, 34, 35, and 36 may have greater horizontal widths than the plurality of active regions 25, 26, and 27.

In an embodiment, the plurality of active regions 25, 26, and 27 may include a single-crystal silicon layer containing N-type impurities, and the plurality of source/drain regions 31, 32, 33, 34, 35, and 36 may include a SiGe layer containing P-type impurities. In an embodiment, the plurality of active regions 25, 26, and 27 may include a single-crystal silicon layer containing P-type impurities, and the plurality of source/drain regions 31, 32, 33, 34, 35, and 36 may include a SiC layer containing N-type impurities or a Si layer containing N-type impurities.

The interlayer insulation layer 39 may cover the plurality of source/drain regions 31, 32, 33, 34, 35, and 36 and the element separation layer 23. The interlayer insulation layer 39 may contain a silicon oxide, a silicon nitride, a silicon oxynitride, a low-K dielectric material, or a combination thereof.

The plurality of gate electrodes 41, 42, and 43 may cross the plurality of active regions 25, 26, and 27, which are disposed between the plurality of source/drain regions 31, 32, 33, 34, 35, and 36. The gate dielectric layer 46 may be formed between the plurality of active regions 25, 26, and 27 and the plurality of gate electrodes 41, 42, and 43. The gate dielectric layer 46 may contain a high-K dielectric material, a silicon oxide, a silicon nitride, a silicon oxynitride, or a combination thereof. For example, the gate dielectric layer 46 may contain a metal oxide such as HfO.

The plurality of gate electrodes 41, 42, and 43 may include a first gate electrode 41, a second gate electrode 42, and a third gate electrode 43. Each of the plurality of gate electrodes 41, 42, and 43 may include a first conductive layer 41A and a second conductive layer 41B. The second conductive layer 41B may be formed on the first conductive layer 41A. The first conductive layer 41A may surround a side surface and a bottom surface of the second conductive layer 41B. The first conductive layer 41A may include a work function conductive layer. For example, the first conductive layer 41A may contain TiN, TaN, or a combination thereof. The first conductive layer 41A may be composed of a single layer or multiple layers. The second conductive layer 41B may contain a metal, a metal silicide, a metal nitride, a metal oxide, a conductive carbon, a polysilicon, or a combination thereof. For example, the second conductive layer 41B may contain W, WN, or a combination thereof. In an embodiment, the plurality of gate electrodes 41, 42, and 43 may each correspond to a replacement gate electrode.

The plurality of gate spacers 47 and 48 may be formed on the side surfaces of the plurality of gate electrodes 41, 42, and 43. The plurality of gate spacers 47 and 48 may each contain a high-K dielectric material, a low-K dielectric material, a silicon oxide, a silicon nitride, a silicon oxynitride, or a combination thereof. The plurality of gate spacers 47 and 48 may include a first gate spacer 47 and a second gate spacer 48. The first gate spacer 47 may contain a material different from that of the second gate spacer 48. The first gate spacer 47 may contain a low-K dielectric material. In an embodiment, the first gate spacer 47 may contain SiOCN, and the second gate spacer 48 may contain a silicon nitride formed at a process temperature of 530° C. to 570° C. The second gate spacer 48 may contain a material with an etch selectivity relative to the interlayer insulation layer 39.

The gate capping layer 49 may cover the plurality of gate electrodes 41, 42, and 43. The gate capping layer 49 may be self-aligned on the plurality of gate electrodes 41, 42, and 43. The gate capping layer 49 may contain a material with an etch selectivity relative to the interlayer insulation layer 39. The gate capping layer 49 may contain a silicon nitride formed at a process temperature of 430° C. to 470° C. The second gate spacer 48 may be preserved between the gate capping layer 49 and the interlayer insulation layer 39. The gate capping layer 49, the interlayer insulation layer 39, and the second gate spacer 48 may have substantially coplanar upper surfaces. The gate capping layer 49 may have a lower surface brought into direct contact with upper surfaces of the plurality of gate electrodes 41, 42, and 43, the first gate spacer 47, and the gate dielectric layer 46.

Figure 20:
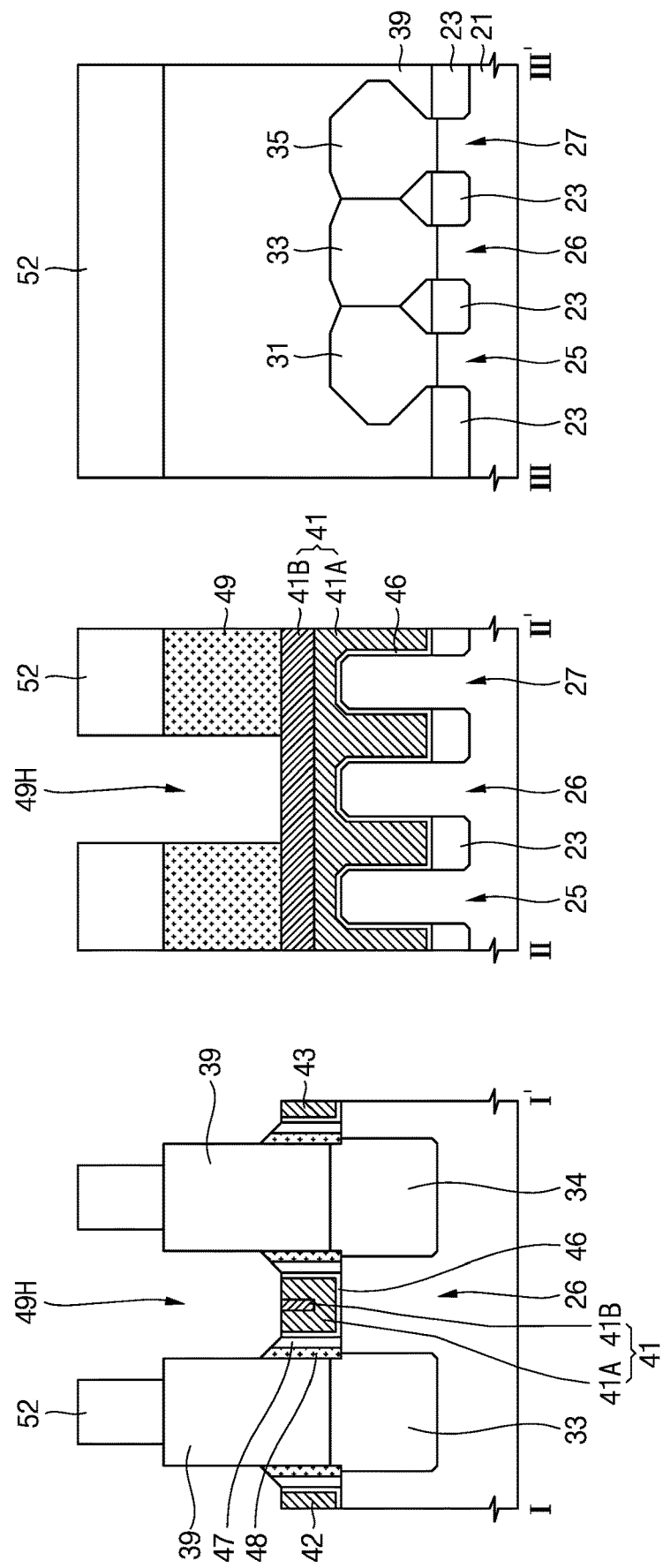

Referring to FIGS. 1 and 20, gate contact holes 49H, which pass through the gate capping layer 49 and expose the plurality of gate electrodes 41, 42, and 43, may be formed by means of a first mask pattern 52.

The first mask pattern 52 may partially cover the interlayer insulation layer 39 and the gate capping layer 49. The first mask pattern 52 may correspond to a hard mask pattern formed by using a thin film forming process and a patterning process. The formation of the gate contact holes 49H may include an anisotropic etching process, an isotropic etching process, or a combination thereof. An etching process with a low etching rate relative to the interlayer insulation layer 39 and a high etching rate relative to the gate capping layer 49 and the plurality of gate spacers 47 and 48 may be applied to the formation of the gate contact holes 49H. It is possible to significantly improve an alignment margin of the first mask pattern 52. The gate contact holes 49H may be self-aligned on the plurality of gate electrodes 41, 42, and 43. In an embodiment, one selected from among the gate contact holes 49H may be aligned on the second active region 26.

The plurality of gate electrodes 41, 42, and 43, the gate dielectric layer 46, and the plurality of gate spacers 47 and 48 may be exposed in the gate contact holes 49H. In an embodiment, the interlayer insulation layer 39 may be exposed at side walls of the gate contact holes 49H.

Figure 21:
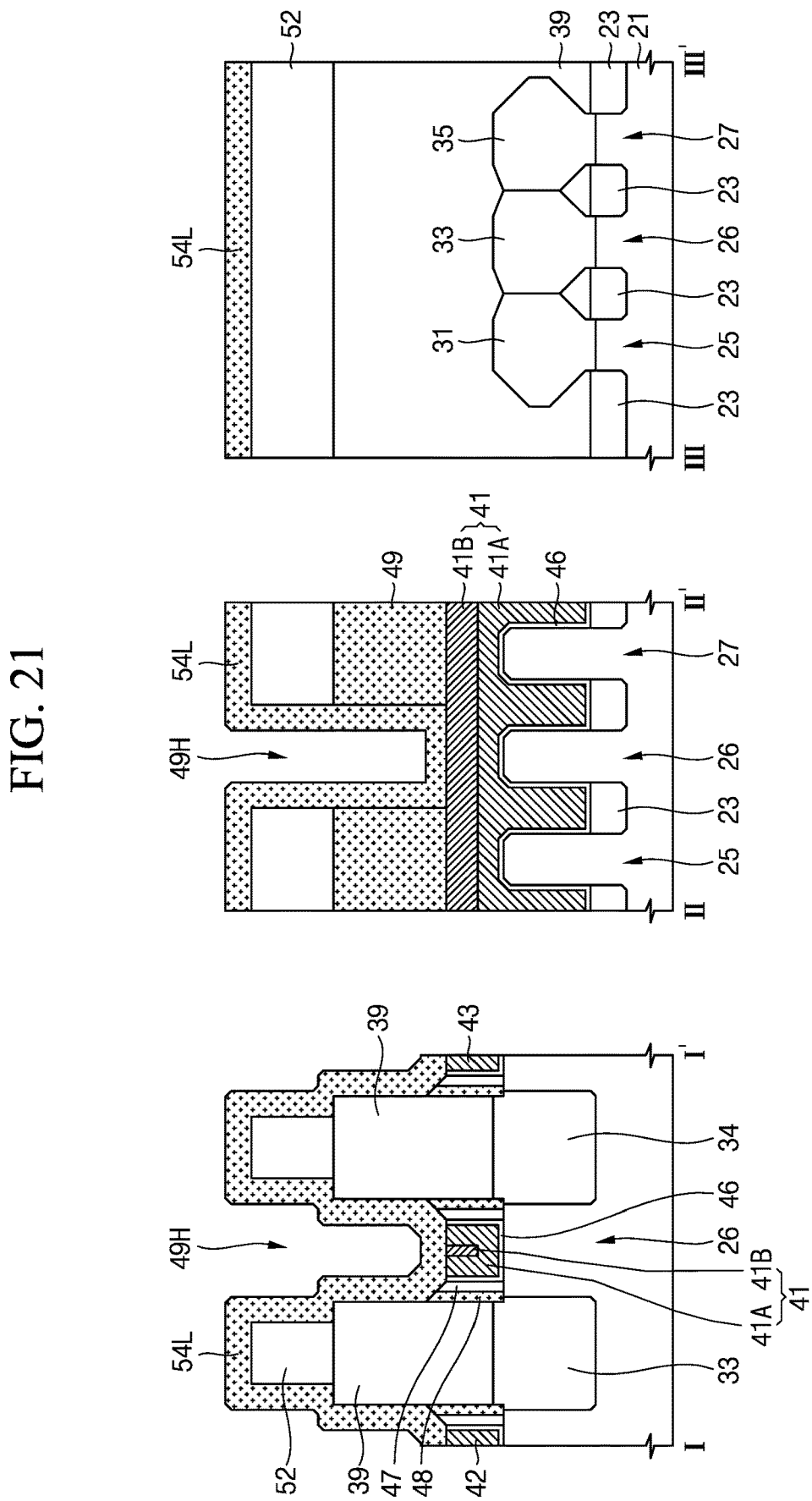

Referring to FIGS. 1 and 21, a gate contact spacer layer 54L may be formed to conformally cover the surface of the substrate 21. The gate contact spacer layer 54L may cover the side walls of the gate contact holes 49H. The gate contact spacer layer 54L may be formed by an atomic layer deposition (ALD) method, a chemical vapor deposition (CVD) method, a cyclic deposition method, or a combination thereof. In an embodiment, the gate contact spacer layer 54L may contain a material with an etch selectivity relative to the interlayer insulation layer 39. The gate contact spacer layer 54L may contain a silicon nitride formed at a process temperature of 430° C. to 470° C.

Figure 22:
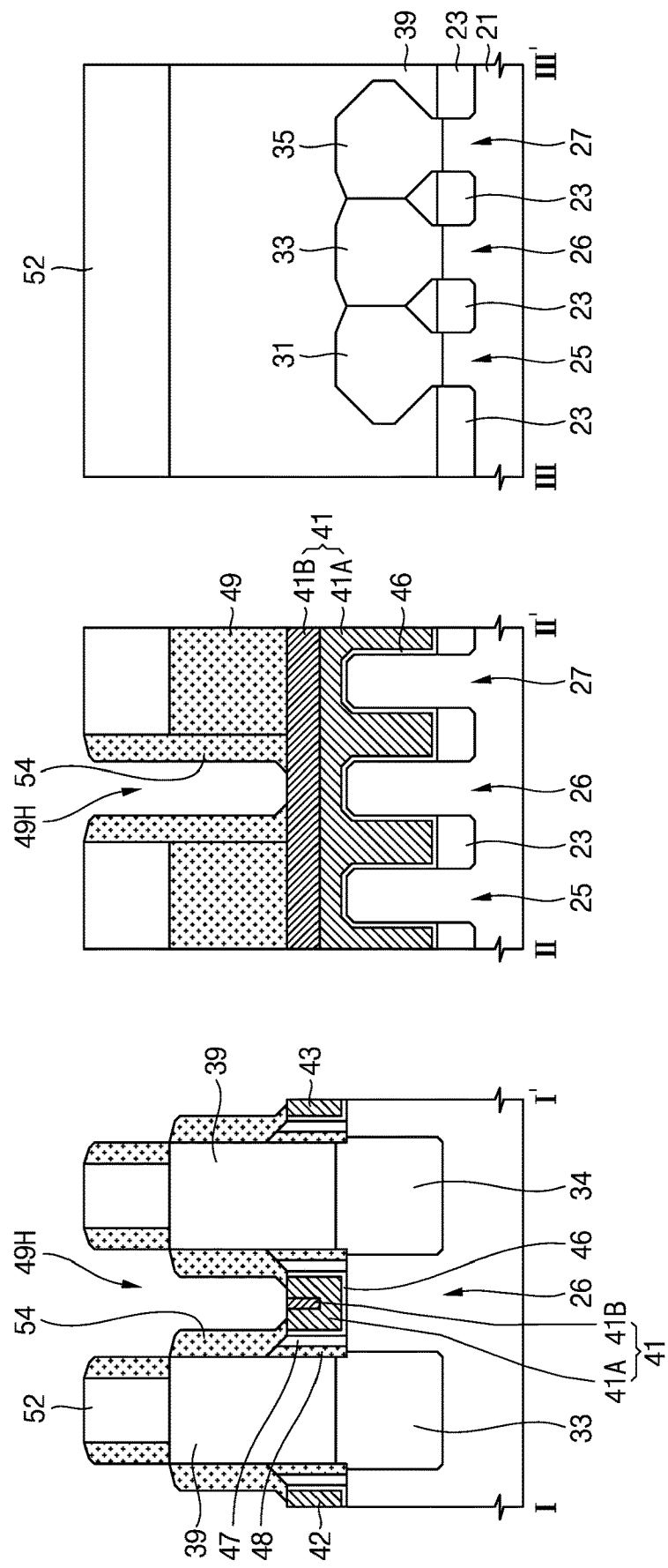

Referring to FIGS. 1 and 22, a gate contact spacer 54 may be formed. The formation of the gate contact spacer 54 may include a process of anisotropically etching the gate contact spacer layer 54L until the plurality of gate electrodes 41, 42, and 43 are exposed in the gate contact holes 49H. The gate contact spacer 54 may cover the side walls of the gate contact holes 49H. The gate contact spacer 54 may be brought into contact with the gate dielectric layer 46 and the plurality of gate spacers 47 and 48.

Figure 23:
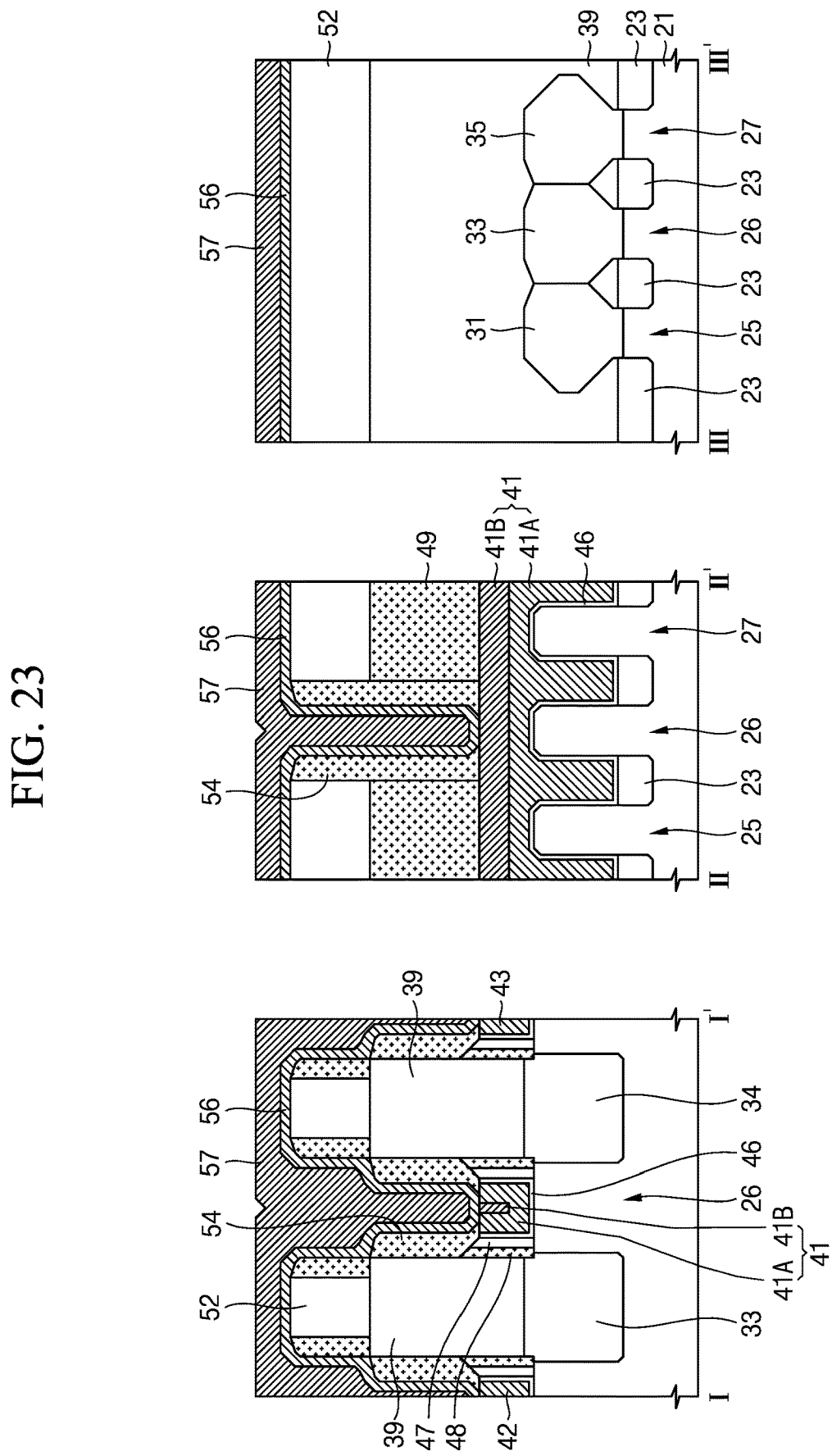

Referring to FIGS. 1 and 23, a first barrier layer 56 and a gate contact conductive layer 57, which fill the gate contact holes 49H and cover the substrate 21, may be formed. The first barrier layer 56 may be brought into direct contact with the plurality of gate electrodes 41, 42, and 43. The first barrier layer 56 may contain Ti, TiN, Ta, TaN, or a combination thereof. The gate contact conductive layer 57 may be formed on the first barrier layer 56. The gate contact conductive layer 57 may contain a metal, a metal silicide, a metal nitride, a metal oxide, a conductive carbon, a polysilicon, or a combination thereof. For example, the gate contact conductive layer 57 may contain W, WN, Co, Ru, or a combination thereof.

Figure 24:
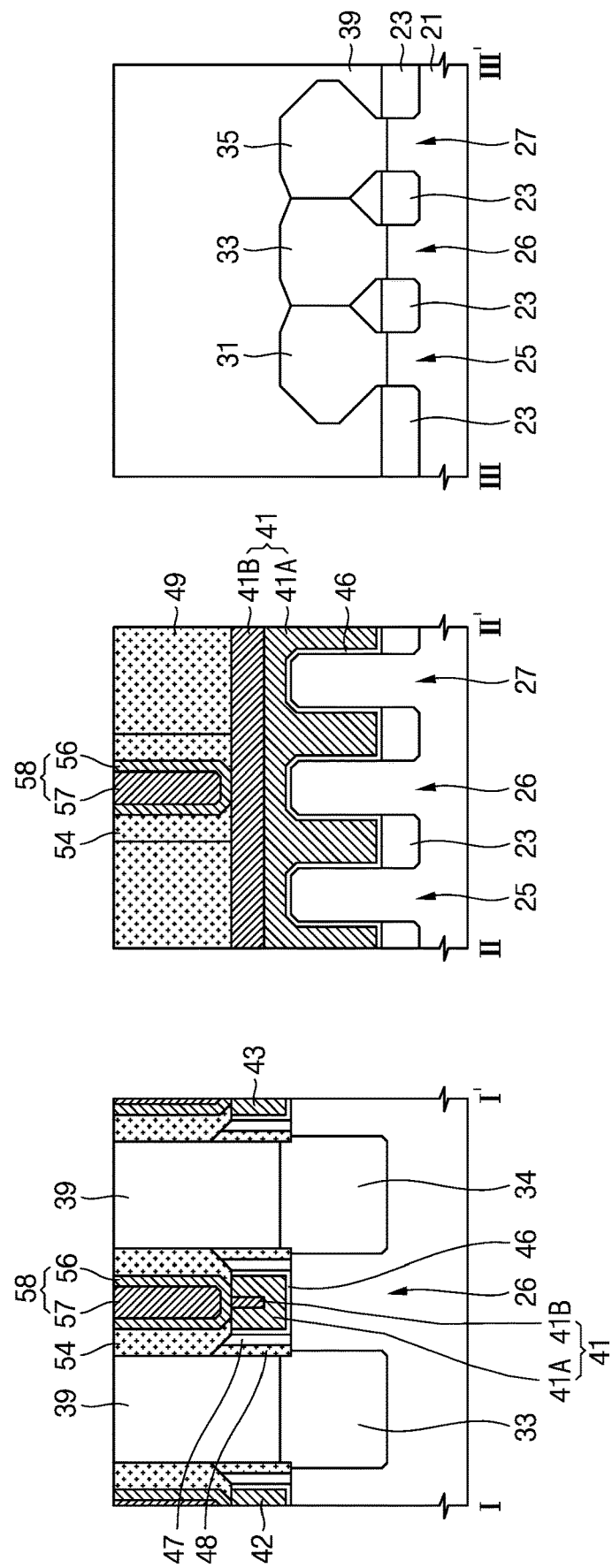

Referring to FIGS. 1 and 24, gate contact plugs 58 may be formed in the gate contact holes 49H. Each of the gate contact plugs 58 may include the first barrier layer 56 and the gate contact conductive layer 57. The first barrier layer 56 may surround a side surface and a bottom surface of the gate contact conductive layer 57. The formation of the gate contact plugs 58 may include a planarization process such as a chemical mechanical polishing (CMP) process, an etch-back process, or a combination thereof. The first mask pattern 52 may all be removed while the gate contact plugs 58 are formed. The gate contact plugs 58, the gate contact spacer 54, the gate capping layer 49, and the interlayer insulation layer 39 may have upper surfaces exposed in substantially the same plane. Each of the gate contact plugs 58 may be self-aligned on the plurality of gate electrodes 41, 42, and 43. In an embodiment, one selected from among the gate contact plugs 58 may be aligned on the second active region 26.

Figure 25:
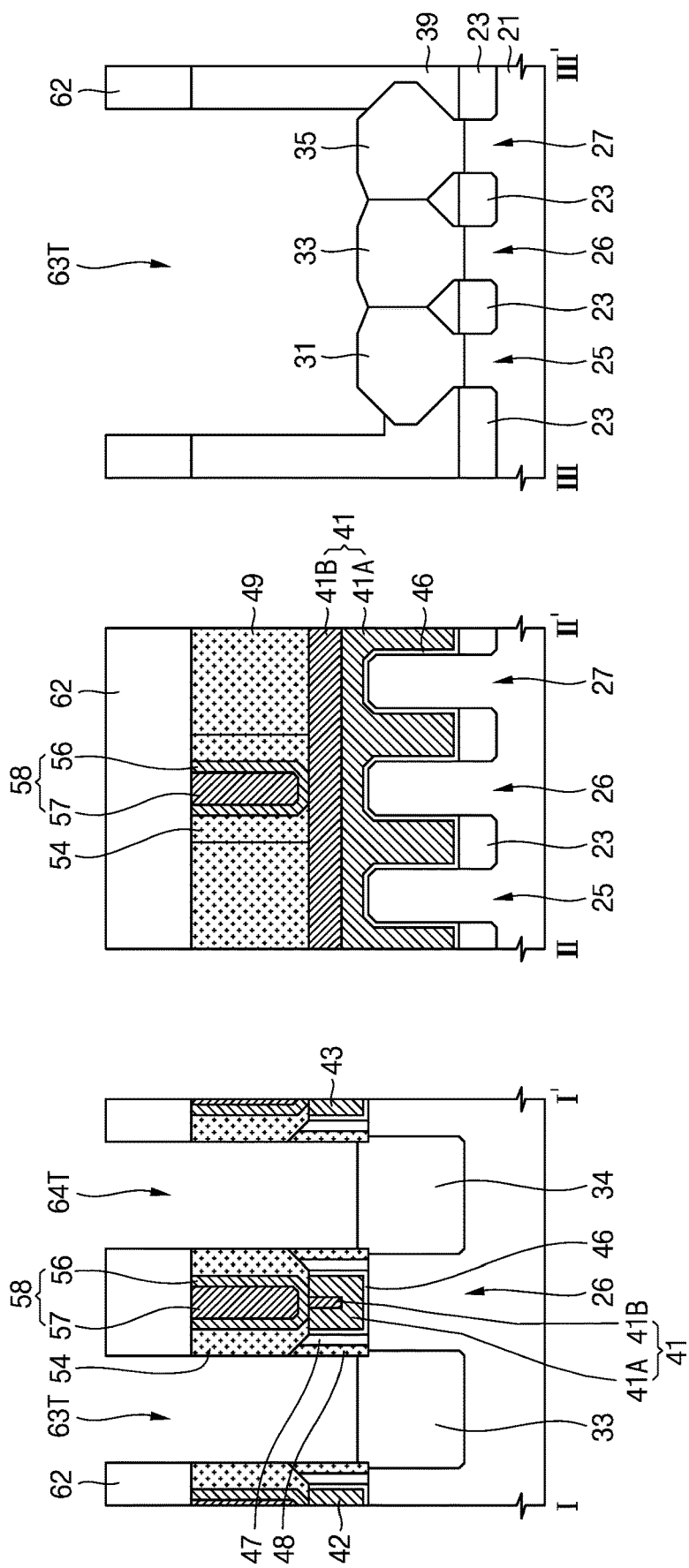

Referring to FIGS. 1 and 25, source/drain trenches 63T and 64T, which pass through the interlayer insulation layer 39, may be formed using the second mask pattern 62 as an etching mask. For brevity of description, it is assumed in the following description that the source/drain trenches 63T and 64T include a drain trench 63T and a source trench 64T.

The second mask pattern 62 may cover the gate contact plugs 58, the gate contact spacer 54, and the gate capping layer 49 and may partially cover the interlayer insulation layer 39. The second mask pattern 62 may correspond to a hard mask pattern formed by using a thin film forming process and a patterning process. The formation of the source/drain trenches 63T and 64T may include an anisotropic etching process, an isotropic etching process, or a combination thereof. An etching process with a high etching rate relative to the interlayer insulation layer 39 and a low etching rate relative to the gate contact spacer 54, the gate capping layer 49, and the plurality of gate spacers 47 and 48 may be applied to the formation of the source/drain trenches 63T and 64T. The plurality of source/drain regions 31, 32, 33, 34, 35, and 36 may be exposed at bottom surfaces of the source/drain trenches 63T and 64T. The gate contact spacer 54, the gate capping layer 49, the plurality of gate spacers 47 and 48, and the interlayer insulation layer 39 may be exposed at side walls of the source/drain trenches 63T and 64T.

Figure 26:
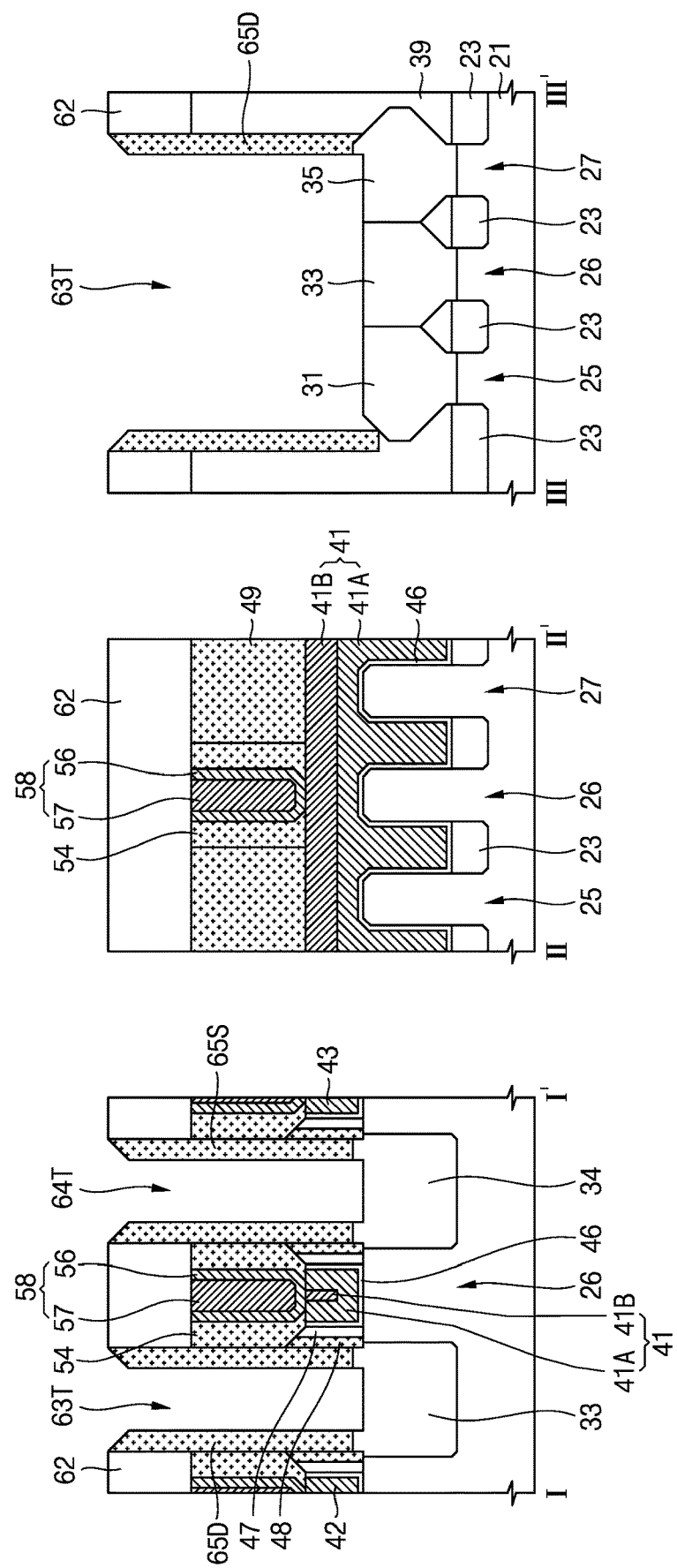

Referring to FIGS. 1 and 26, a drain contact spacer 65D may be formed on the side wall of the drain trench 63T, and a source contact spacer 65S may be formed on the side wall of the source trench 64T. The drain contact spacer 65D and the source contact spacer 65S may be brought into contact with the gate contact spacer 54, the gate capping layer 49, the plurality of gate spacers 47 and 48, and the interlayer insulation layer 39. The formation of the drain contact spacer 65D and the source contact spacer 65S may include a thin film forming process and an anisotropic etching process. The drain contact spacer 65D and the source contact spacer 65S may be formed by an atomic layer deposition (ALD) method, a chemical vapor deposition (CVD) method, a cyclic deposition method, or a combination thereof. In an embodiment, the drain contact spacer 65D and the source contact spacer 65S may contain a silicon nitride formed at a process temperature of 430° C. to 470° C.

Figure 27:
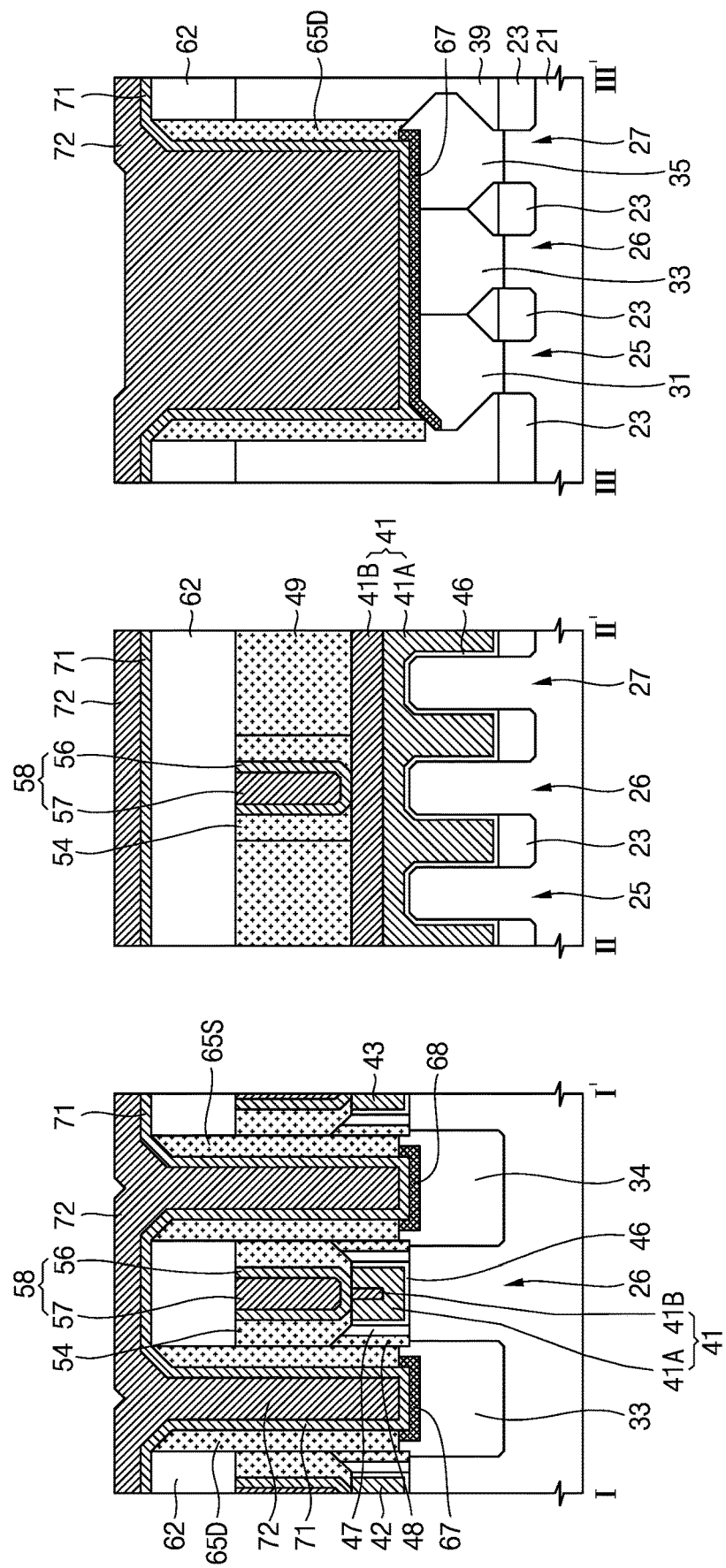

Referring to FIGS. 1 and 27, metal silicide layers 67 and 68 may be formed on the plurality of source/drain regions 31, 32, 33, 34, 35, and 36 exposed at the bottom surfaces of the source/drain trenches 63T and 64T. A second barrier layer 71 and a source/drain contact conductive layer 72, which fill the source/drain trenches 63T and 64T and cover the substrate 21, may be formed. The second barrier layer 71 may contain Ti, TiN, Ta, TaN, or a combination thereof. The source/drain contact conductive layer 72 may be formed on the second barrier layer 71. The source/drain contact conductive layer 72 may contain a metal, a metal silicide, a metal nitride, a metal oxide, a conductive carbon, a polysilicon, or a combination thereof. For example, the source/drain contact conductive layer 72 may contain W, WN, Co, Ru, or a combination thereof.

Figure 28:
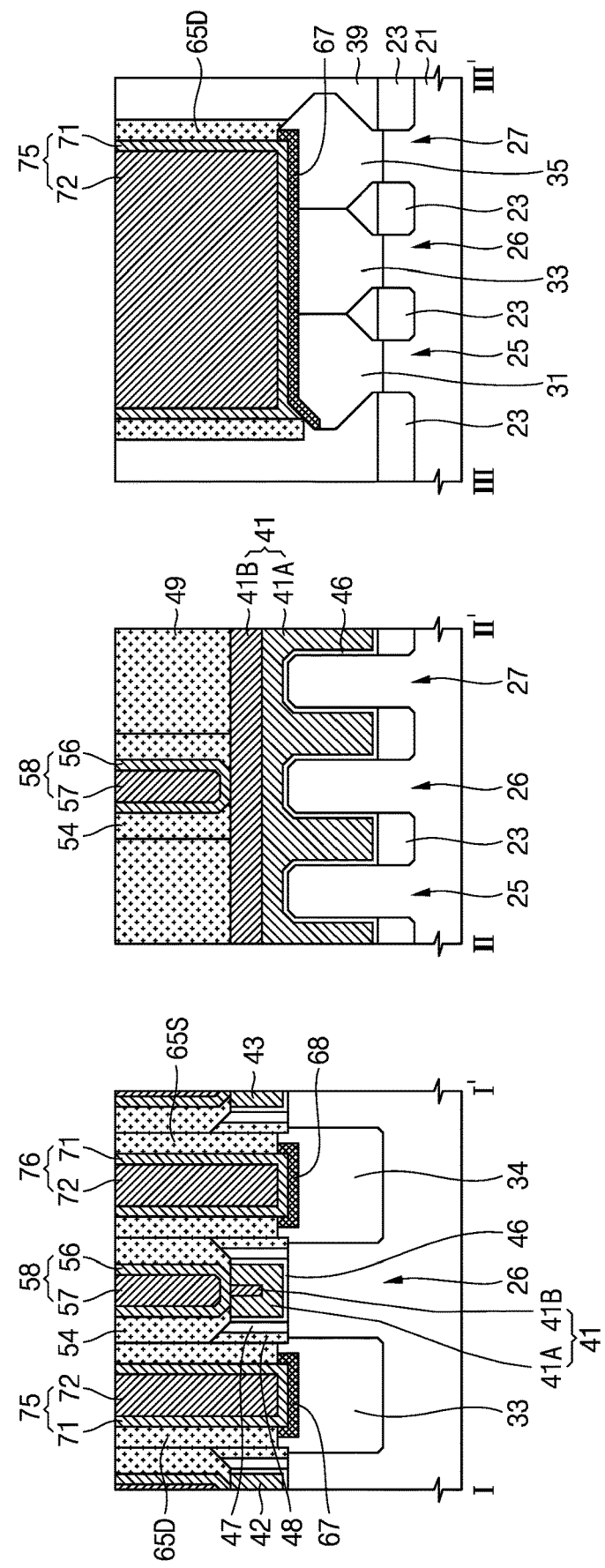

Referring to FIGS. 1 and 28, a plurality of source/drain contact plugs 75 and 76 may be formed. The plurality of source/drain contact plugs 75 and 76 may include a drain contact plug 75 and a source contact plug 76. The drain contact plug 75 may be formed in the drain trench 63T, and the source contact plug 76 may be formed in the source trench 64T. Each of the plurality of source/drain contact plugs 75 and 76 may include the source/drain contact conductive layer 72 and the second barrier layer 71 that surrounds a side surface and a bottom surface of the source/drain contact conductive layer 72.

The formation of the plurality of source/drain contact plugs 75 and 76 may include a planarization process such as a chemical mechanical polishing (CMP) process, an etch-back process, or a combination thereof. The second mask pattern 62 may be entirely removed while the plurality of source/drain contact plugs 75 and 76 are formed. The plurality of source/drain contact plugs 75 and 76, the drain contact spacer 65D, the source contact spacer 65S, the gate contact plugs 58, the gate contact spacer 54, the gate capping layer 49, and the interlayer insulation layer 39 may have upper surfaces exposed in substantially the same plane.

Referring to FIGS. 1 and 2 again, an etch stop layer 83, an upper insulation layer 85, a plurality of upper source/drain contact plugs 95 and 96, and a plurality of upper gate contact plugs 97 may be formed. The plurality of upper source/drain contact plugs 95 and 96 may include an upper drain contact plug 95 and an upper source contact plug 96.

The etch stop layer 83 may cover the plurality of source/drain contact plugs 75 and 76, the drain contact spacer 65D, the source contact spacer 65S, the gate contact plugs 58, the gate contact spacer 54, the gate capping layer 49, and the interlayer insulation layer 39. The upper insulation layer 85 may be formed on the etch stop layer 83. The etch stop layer 83 may contain a material with an etch selectivity relative to the upper insulation layer 85. In an embodiment, the upper insulation layer 85 may contain a silicon oxide, and the etch stop layer 83 may contain a silicon nitride. The plurality of upper gate contact plugs 97 may be brought into contact with the gate contact plugs 58 through the upper insulation layer 85 and the etch stop layer 83. The upper drain contact plug 95 may be brought into contact with the drain contact plug 75 through the upper insulation layer 85 and the etch stop layer 83, and the upper source contact plug 96 may be brought into contact with the source contact plug 76 through the upper insulation layer 85 and the etch stop layer 83.

Each of the plurality of upper source/drain contact plugs 95 and 96 and the plurality of upper gate contact plugs 97 may include an upper contact conductive layer 92 and a third barrier layer 91, which surrounds a side surface and a bottom surface of the upper contact conductive layer 92. The third barrier layer 91 may contain Ti, TiN, Ta, TaN, or a combination thereof. The upper contact conductive layer 92 may contain a metal, a metal silicide, a metal nitride, a metal oxide, a conductive carbon, a polysilicon, or a combination thereof. For example, the upper contact conductive layer 92 may contain W, WN, Co, Ru, Cu, or a combination thereof.

FIGS. 29 to 33 are partial diagrams for illustrating a method of forming a semiconductor device according to exemplary embodiments of the present inventive concept.

Referring to FIG. 29, the first mask pattern 52 may have an alignment error due to a patterning process. An etching process with a low etching rate relative to the interlayer insulation layer 39 and a high etching rate relative to the gate capping layer 49 and the plurality of gate spacers 47 and 48 may be applied to the formation of the gate contact holes 49H. It is possible to significantly improve an alignment margin of the first mask pattern 52.

Referring to FIG. 30, a second gate spacer 48 may be exposed at the side walls of the gate contact holes 49H. The interlayer insulation layer 39 and the second gate spacer 48 may have substantially coplanar upper surfaces. The second gate spacer 48 may have an upper portion formed at a higher level than that of the first gate spacer 47.

Referring to FIG. 31, the first gate spacer 47 may be exposed at the side surfaces of the gate contact holes 49H. The first gate spacer 47 may have a lower region formed between the first gate electrode 41 and the second gate spacer 48 and have an upper region exposed in the gate contact holes 49H. The upper region of the first gate spacer 47 may have a smaller thickness than the lower region of the first gate spacer 47. The interlayer insulation layer 39, the first gate spacer 47, and the second gate spacer 48 may have substantially coplanar upper surfaces. The first gate spacer 47 may have an upper portion formed at a higher level than that of the gate dielectric layer 46.

Referring to FIG. 32, the first gate spacer 47 may be exposed at the side surfaces of the gate contact holes 49H. The first gate spacer 47 may have an upper portion formed at a higher level than that of the gate dielectric layer 46.

Referring to FIG. 33, the gate dielectric layer 46 may be exposed at the side surfaces of the gate contact holes 49H. The interlayer insulation layer 39, the first gate spacer 47, the second gate spacer 48, and the gate dielectric layer 46 may have substantially coplanar upper surfaces.

Figure 34:
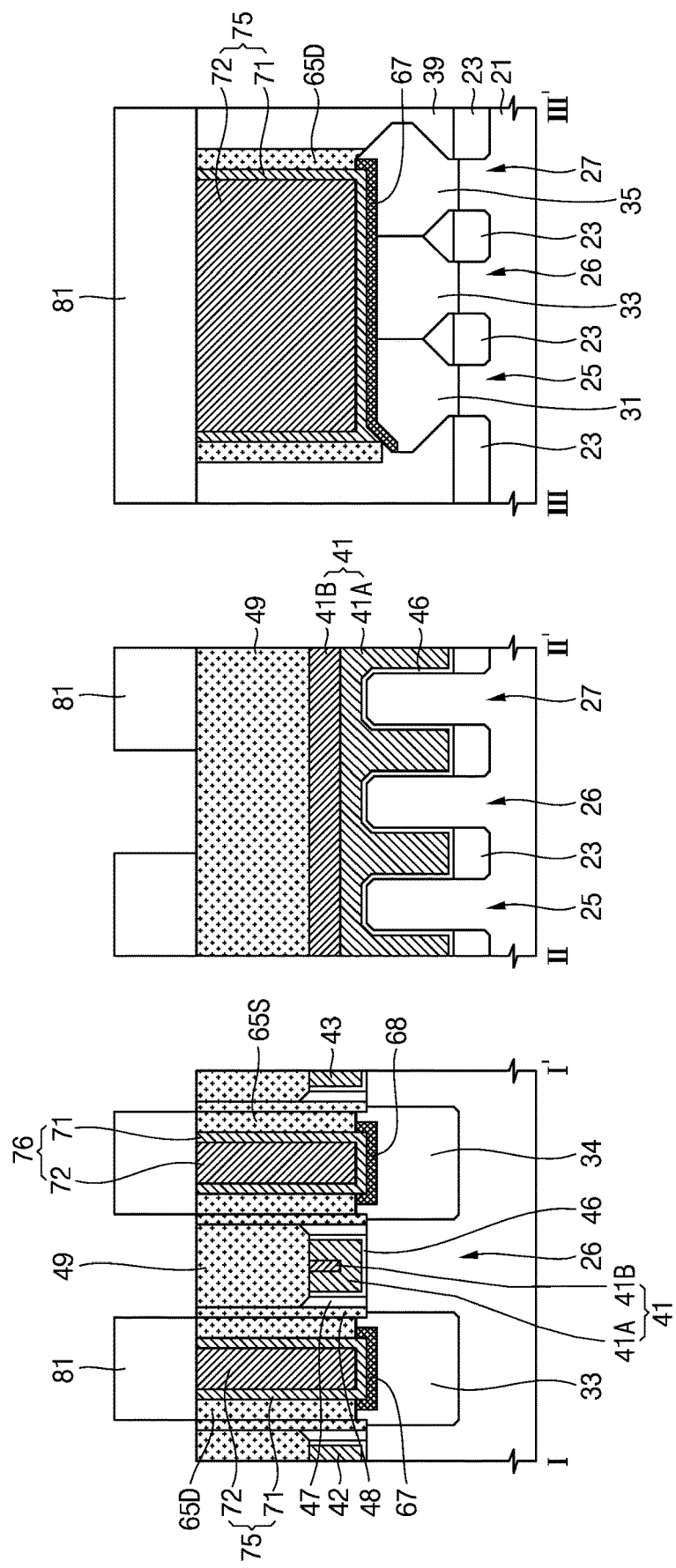
FIGS. 34 and 35 are sectional views taken along lines I-I', II-II', and III-III' of FIG. 1 in order to illustrate a method of forming a semiconductor device according to exemplary embodiments of the present inventive concept.
Figure 35:
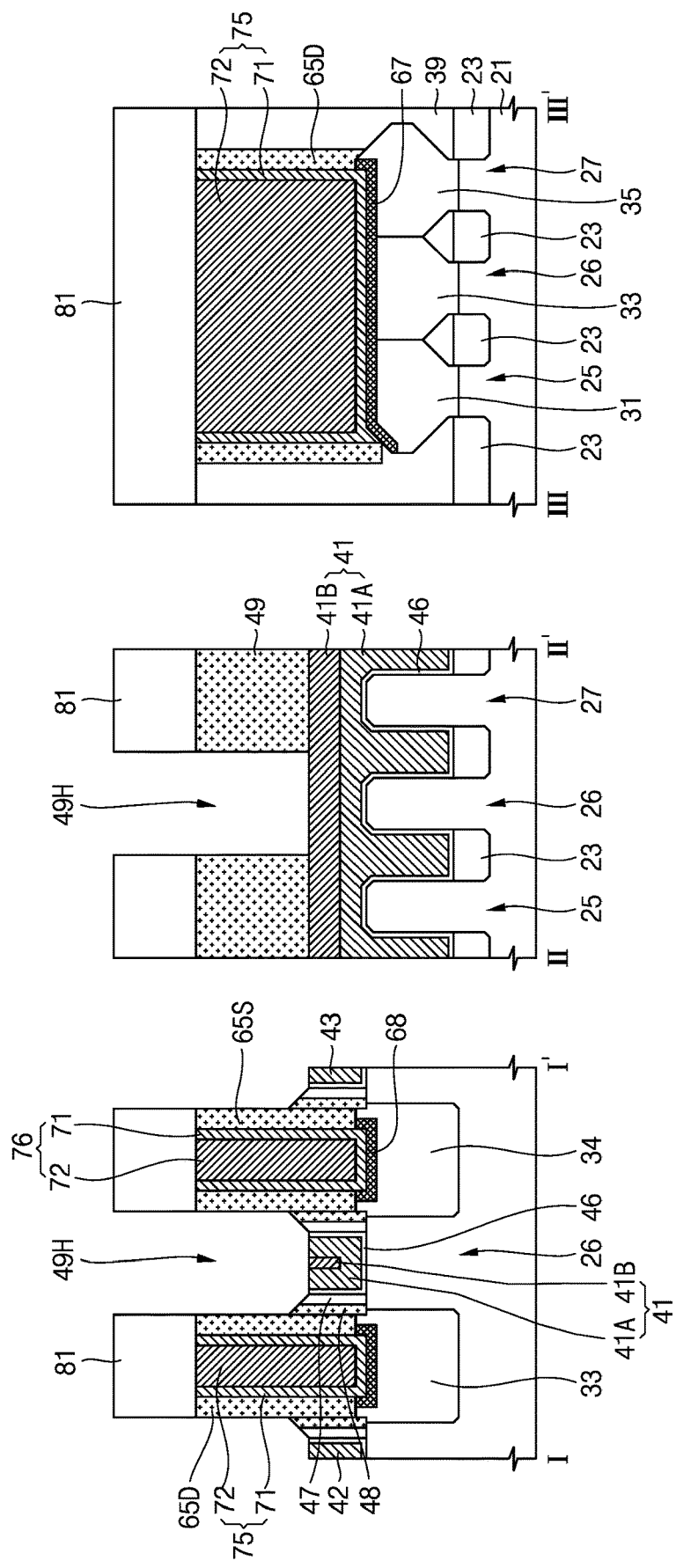

FIGS. 34 and 35 show sectional views taken along lines I-I', II-II', and III-III' of FIG. 1 in order to illustrate a method of forming a semiconductor device according to exemplary embodiments of the present inventive concept.

Referring to FIGS. 1 and 34, an element separation layer 23, a plurality of active regions 25, 26, and 27, a plurality of source/drain regions 31, 32, 33, 34, 35, and 36, an interlayer insulation layer 39, a plurality of gate electrodes 41, 42, and 43, a gate dielectric layer 46, a plurality of gate spacers 47 and 48, a gate capping layer 49, a drain contact spacer 65D, a source contact spacer 65S, metal silicide layers 67 and 68, and a plurality of source/drain contact plugs 75 and 76 may be formed on a substrate 21. A third mask pattern 81 may be formed on the gate capping layer 49, the drain contact spacer 65D, the source contact spacer 65S, and the plurality of source/drain contact plugs 75 and 76.

Referring to FIGS. 1 and 35, gate contact holes 49H passing through the gate capping layer 49 may be formed using the third mask pattern 81 as an etching mask. In an embodiment, the plurality of gate spacers 47 and 48 may be partially removed while the gate contact holes 49H are formed. The drain contact spacer 65D and the source contact spacer 65S may be exposed at side walls of the gate contact holes 49H. The plurality of gate electrodes 41, 42, and 43, the gate dielectric layer 46, and the plurality of gate spacers 47 and 48 may be exposed at bottom surfaces of the gate contact holes 49H. Subsequently, the gate contact spacer 54 and the plurality of gate contact plugs 58 may be formed using a process similar to those described with reference to FIGS. 21 to 24.

According to the exemplary embodiments of the present inventive concept, a gate contact plug is provided between a drain contact plug and a source contact plug. The gate contact plug may be self-aligned on a gate electrode and may be aligned adjacent to a center of an active region. It is possible to implement a semiconductor device that is advantageous for high integration and has high mass-production efficiency.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A semiconductor device comprising:
a plurality of active regions spaced apart from each other and extending linearly in parallel on a substrate;
a gate electrode crossing the plurality of active regions;
respective drain regions on and/or in respective ones of the active regions on a first side of the gate electrode;
respective source regions on and/or in respective ones of the active regions on a second side of the gate electrode;
a drain contact structure on multiple ones of the drain regions;
a source contact structure on multiple ones of the source regions; and
a gate contact structure on the gate electrode between the drain contact structure and the source contact structure,
wherein the gate contact structure includes a gate plug on the gate electrode and an upper gate plug directly on the gate plug,
wherein a center of the gate contact structure overlies only one of the active regions.

2. The semiconductor device of claim 1, wherein the drain contact structure comprises:
a drain plug on the multiple ones of the drain regions; and
an upper drain plug on the drain plug,
wherein the source contact structure comprises:
a source plug on the multiple ones of the drain regions; and
an upper source plug on the drain plug,
and wherein the upper gate plug, the upper drain plug, and the upper source plug have substantially coplanar upper surfaces.

3. The semiconductor device of claim 2, wherein a top of the upper drain plug is higher than an upper surface of the drain plug.

4. The semiconductor device of claim 2, wherein the upper drain plug overlies only one of the respective drain regions.

5. The semiconductor device of claim 2, wherein the upper drain plug overlies only one of the active regions.

6. The semiconductor device of claim 2, wherein top surfaces of the gate plug, the drain plug, and the source plug are substantially coplanar.

7. The semiconductor device of claim 2, wherein the plurality of active regions comprises:
a first active region; and
a second active region adjacent to the first active region,
wherein the upper drain plug is closer to the first active region than to the second active region, and wherein the upper source plug is closer to the second active region than to the first active region.

8. The semiconductor device of claim 2, further comprising:
a drain contact spacer on a side surface of the drain plug;
a source contact spacer on a side surface of the source plug; and
a gate contact spacer on a side surface of the gate plug,
wherein the gate contact spacer, the drain contact spacer and the source contact spacer comprise respective separate layers.

9. The semiconductor device of claim 8, wherein the gate contact spacer is in direct contact with the drain contact spacer and the source contact spacer.

10. The semiconductor device of claim 1, wherein a straight line passing through a center of the drain contact structure and a center of the source contact structure intersects the gate contact structure.

11. The semiconductor device of claim 1, wherein a center of the upper gate plug overlies only one of the active regions.

* * * * *